(12) United States Patent
Woo

(10) Patent No.: US 11,048,410 B2
(45) Date of Patent: Jun. 29, 2021

(54) DISTRIBUTED PROCEDURE EXECUTION AND FILE SYSTEMS ON A MEMORY INTERFACE

(71) Applicant: Rambus Inc., Sunnyvale, CA (US)

(72) Inventor: Steven C. Woo, Saratoga, CA (US)

(73) Assignee: Rambus Inc., San Jose, CA (US)

( * ) Notice: Subject to any disclaimer, the term of this patent is extended or adjusted under 35 U.S.C. 154(b) by 790 days.

(21) Appl. No.: 14/187,290

(22) Filed: Feb. 23, 2014

(65) Prior Publication Data

US 2014/0201431 A1 Jul. 17, 2014

Related U.S. Application Data

(63) Continuation-in-part of application No. PCT/US2012/052000, filed on Aug. 23, 2012, and a continuation-in-part of application No. PCT/US2012/052043, filed on Aug. 23, 2012, and a continuation-in-part of application No. PCT/US2012/052052, filed on Aug. 23, 2012, and a
(Continued)

(51) Int. Cl.
*G06F 3/06* (2006.01)
*G11C 7/10* (2006.01)
*G06F 13/16* (2006.01)

(52) U.S. Cl.
CPC ............ *G06F 3/0604* (2013.01); *G06F 3/064* (2013.01); *G06F 3/0605* (2013.01); *G06F 3/0679* (2013.01); *G06F 13/1694* (2013.01); *G11C 7/10* (2013.01)

(58) Field of Classification Search
None
See application file for complete search history.

(56) References Cited

U.S. PATENT DOCUMENTS 5,237,673 A 8/1993 Orbits et al.
5,269,013 A 12/1993 Abramson et al.
(Continued)

FOREIGN PATENT DOCUMENTS

CN 103309836 A 9/2013
EP 0492938 B1 11/1995
(Continued)

OTHER PUBLICATIONS

Webopedia, "RPC", Oct. 1, 2002, pp. 1-2, https://web.archive.org/web/20021001231311/http://www.webopedia.com/TERM/R/RPC.html.*
(Continued)

*Primary Examiner* — Christopher D Birkhimer
(74) *Attorney, Agent, or Firm* — The Neudeck Law Firm, LLC

(57) ABSTRACT

Nonvolatile memory (e.g., flash memory, solid-state disk) is included on memory modules that are on a DRAM memory channel. Nonvolatile memory residing on a DRAM memory channel may be integrated into the existing file system structures of operating systems. The nonvolatile memory residing on a DRAM memory channel may be presented as part or all of a distributed file system. Requests and/or remote procedure call (RPC) requests, or information associated with requests and/or RPCs, may be routed to the memory modules over the DRAM memory channel in order to service compute and/or distributed file system commands.

20 Claims, 27 Drawing Sheets

Related U.S. Application Data continuation-in-part of application No. PCT/US2012/052059, filed on Aug. 23, 2012, and a continuation-in-part of application No. 14/064,167, filed on Oct. 27, 2013, now Pat. No. 9,098,209.

(60) Provisional application No. 61/788,196, filed on Mar. 15, 2013, provisional application No. 61/526,953, filed on Aug. 24, 2011, provisional application No. 61/647,986, filed on May 16, 2012, provisional application No. 61/670,874, filed on Jul. 12, 2012, provisional application No. 61/691,134, filed on Aug. 20, 2012, provisional application No. 61/732,898, filed on Dec. 3, 2012.

(56) References Cited

U.S. PATENT DOCUMENTS

| | | | |
|---|---|---|---|
| 5,442,210 A * | 8/1995 | Kanehachi | H01L 27/0629 257/296 |
| 5,625,796 A | 4/1997 | Kaczmarczyk et al. | |
| 5,742,792 A * | 4/1998 | Yanai | G06F 3/0601 710/1 |
| 6,026,088 A * | 2/2000 | Rostoker | G06F 13/128 348/E5.002 |
| 6,286,092 B1 | 9/2001 | Frank et al. | |
| 6,542,971 B1 | 4/2003 | Reed | |
| 6,864,896 B2 | 3/2005 | Perego | |
| 6,970,891 B1 | 11/2005 | Deo et al. | |
| 7,024,518 B2 | 4/2006 | Halbert et al. | |
| 7,032,158 B2 | 4/2006 | Alvarez, II et al. | |
| 7,046,467 B1 * | 5/2006 | Chheda | G06F 3/0608 360/48 |
| 7,107,412 B2 | 9/2006 | Klein et al. | |
| 7,162,627 B2 | 1/2007 | Chen | |
| 7,171,494 B2 | 1/2007 | Karamanolis et al. | |
| 7,224,595 B2 * | 5/2007 | Dreps | G11C 5/04 361/728 |
| 7,287,103 B2 | 10/2007 | Ganfield et al. | |
| 7,318,118 B2 * | 1/2008 | Chu | G06F 3/0616 711/103 |
| 7,383,416 B2 | 6/2008 | Oeschay et al. | |
| 7,405,472 B2 * | 7/2008 | Kawano | H01L 23/3128 257/686 |
| 7,424,552 B2 | 9/2008 | Burton | |
| 7,472,222 B2 * | 12/2008 | Auerbach | G06F 1/3221 711/112 |
| 7,480,830 B2 | 1/2009 | Cowell et al. | |
| 7,490,211 B2 | 2/2009 | Schnepper | |
| 7,506,110 B2 | 3/2009 | Neils et al. | |
| 7,525,547 B1 | 4/2009 | Diard | |
| 7,526,634 B1 | 4/2009 | Duluk, Jr. et al. | |
| 7,529,903 B2 * | 5/2009 | Boss | G06F 3/0605 711/165 |
| 7,539,812 B2 | 5/2009 | Tetrick | |
| 7,623,134 B1 | 11/2009 | Danilak | |
| 7,633,505 B1 | 12/2009 | Kelleher | |
| 7,669,026 B2 * | 2/2010 | Boss | G06F 3/0605 711/165 |
| 7,676,636 B2 * | 3/2010 | Cypher | G06F 12/08 711/141 |
| 7,680,968 B2 | 3/2010 | Burton | |
| 7,689,734 B2 | 3/2010 | Bellows | |
| 7,694,093 B2 | 4/2010 | Shaw et al. | |
| 7,720,636 B1 * | 5/2010 | Baxter | G06F 11/3409 702/182 |
| 7,765,081 B2 * | 7/2010 | Blouin | H04L 12/2697 700/121 |
| 7,792,918 B2 * | 9/2010 | Corry | G06F 3/0604 709/216 |
| 7,796,414 B2 | 9/2010 | Hofstra | |
| 7,818,497 B2 * | 10/2010 | Gower | G06F 13/1668 365/189.04 |
| 7,840,748 B2 * | 11/2010 | Gower | G06F 13/1668 365/189.05 |
| 7,865,674 B2 * | 1/2011 | Gower | G06F 13/1684 365/189.02 |
| 7,870,323 B2 | 1/2011 | Matsumoto et al. | |
| 7,899,983 B2 * | 3/2011 | Gower | G11C 5/04 365/189.05 |
| 7,941,591 B2 | 5/2011 | Aviles | |
| 7,970,956 B2 | 6/2011 | Asaro et al. | |
| 7,996,602 B1 | 8/2011 | Warnes et al. | |
| 8,006,057 B2 | 8/2011 | LaBerge | |
| 8,019,919 B2 * | 9/2011 | Gower | G06F 13/1684 365/189.05 |
| 8,054,676 B2 | 11/2011 | Tanguay et al. | |
| 8,131,913 B2 | 3/2012 | Pyeon | |
| 8,286,044 B2 * | 10/2012 | Foster, Sr. | G06F 1/206 714/718 |
| 8,364,867 B2 | 1/2013 | Karamcheti et al. | |
| 2001/0040750 A1 * | 11/2001 | Murakami | G06F 3/0607 360/69 |
| 2002/0059492 A1 | 5/2002 | Sabotta et al. | |
| 2003/0154371 A1 | 8/2003 | Lai et al. | |
| 2004/0049624 A1 | 3/2004 | Salmonsen | |
| 2004/0230718 A1 | 11/2004 | Polzin et al. | |
| 2004/0260864 A1 | 12/2004 | Lee et al. | |
| 2005/0223303 A1 | 10/2005 | Zimmerman et al. | |
| 2006/0023482 A1 * | 2/2006 | Dreps | G11C 5/04 365/63 |
| 2006/0041711 A1 | 2/2006 | Miura et al. | |
| 2006/0080501 A1 * | 4/2006 | Auerbach | G06F 1/3221 711/112 |
| 2006/0200723 A1 | 9/2006 | Carnevale et al. | |
| 2006/0248253 A1 | 11/2006 | Wang | |
| 2006/0267990 A1 | 11/2006 | Rogers et al. | |
| 2007/0016725 A1 * | 1/2007 | Chu | G06F 3/0616 711/113 |
| 2007/0064500 A1 | 3/2007 | Harmsze et al. | |
| 2007/0079049 A1 | 4/2007 | LaBerge | |
| 2007/0121389 A1 | 5/2007 | Wu et al. | |
| 2007/0132770 A1 | 6/2007 | Stefanidis et al. | |
| 2007/0195613 A1 | 8/2007 | Rajan et al. | |
| 2007/0283337 A1 | 12/2007 | Kasahara et al. | |
| 2007/0283358 A1 | 12/2007 | Kasahara et al. | |
| 2007/0290333 A1 * | 12/2007 | Saini | G11C 5/02 257/723 |
| 2008/0077740 A1 | 3/2008 | Clark et al. | |
| 2008/0082488 A1 | 4/2008 | Terrell | |
| 2008/0082733 A1 | 4/2008 | Karamcheti et al. | |
| 2008/0109593 A1 * | 5/2008 | Karamcheti | G06F 9/5016 711/103 |
| 2008/0126690 A1 | 5/2008 | Rajan et al. | |
| 2008/0155187 A1 | 6/2008 | Skerlj | |
| 2008/0172539 A1 * | 7/2008 | Boss | G06F 3/0605 711/165 |
| 2008/0256416 A1 | 10/2008 | Ozawa | |
| 2008/0320255 A1 * | 12/2008 | Wingard | G06F 12/0607 711/157 |
| 2009/0019231 A1 * | 1/2009 | Cypher | G06F 12/08 711/141 |
| 2009/0037657 A1 | 2/2009 | Bresniker | |
| 2009/0063761 A1 * | 3/2009 | Gower | G06F 13/1668 711/105 |
| 2009/0063784 A1 * | 3/2009 | Gower | G06F 13/4059 711/148 |
| 2009/0063785 A1 * | 3/2009 | Gower | G11C 5/04 711/148 |
| 2009/0063787 A1 * | 3/2009 | Gower | G06F 13/1668 711/149 |
| 2009/0106493 A1 * | 4/2009 | Tsuji | G06F 3/0605 711/114 |
| 2009/0157989 A1 | 6/2009 | Karamcheti et al. | |
| 2009/0276559 A1 | 11/2009 | Allen, Jr. et al. | |
| 2009/0319719 A1 | 12/2009 | Perego et al. | |
| 2009/0327596 A1 | 12/2009 | Christenson et al. | |
| 2010/0010835 A1 * | 1/2010 | Johnson | G06F 19/328 705/3 |

(56) References Cited

U.S. PATENT DOCUMENTS

| | | | |
|---|---|---|---|
| 2010/0011350 A1* | 1/2010 | Zayas | G06F 8/65 717/171 |
| 2010/0011427 A1* | 1/2010 | Zayas | G06F 21/80 726/7 |
| 2010/0017650 A1 | 1/2010 | Chin et al. | |
| 2010/0037062 A1* | 2/2010 | Carney | H04L 9/3247 713/176 |
| 2010/0057881 A1* | 3/2010 | Corry | G06F 3/0604 709/216 |
| 2010/0122124 A1* | 5/2010 | Chen | G06F 9/45558 714/57 |
| 2010/0161563 A1* | 6/2010 | Arunachalam | H04L 43/0805 707/674 |
| 2010/0169559 A1* | 7/2010 | Harari | G06F 13/4068 711/103 |
| 2010/0169561 A1* | 7/2010 | Harari | G06F 13/4068 711/103 |
| 2010/0185816 A1* | 7/2010 | Sauber | G06F 12/0886 711/122 |
| 2010/0205360 A1* | 8/2010 | Harari | G06F 13/4068 711/103 |
| 2010/0205367 A1* | 8/2010 | Ehrlich | G06F 12/0804 711/113 |
| 2010/0211728 A1 | 8/2010 | Naujokat | |
| 2010/0217924 A1 | 8/2010 | Panabaker et al. | |
| 2011/0004709 A1* | 1/2011 | Gower | G06F 13/1684 710/51 |
| 2011/0023040 A1 | 1/2011 | Hendry et al. | |
| 2011/0035539 A1 | 2/2011 | Honda | |
| 2011/0035575 A1 | 2/2011 | Kwon | |
| 2011/0066790 A1 | 3/2011 | Mogul et al. | |
| 2011/0066903 A1* | 3/2011 | Foster, Sr. | G06F 1/206 714/723 |
| 2011/0082971 A1 | 4/2011 | Berke | |
| 2011/0099244 A1 | 4/2011 | Yang et al. | |
| 2011/0145493 A1 | 6/2011 | Ahn et al. | |
| 2011/0153916 A1 | 6/2011 | Chinnaswamy et al. | |
| 2011/0153925 A1 | 6/2011 | Bains et al. | |
| 2011/0161569 A1 | 6/2011 | Shan et al. | |
| 2011/0173371 A1* | 7/2011 | Karamcheti | G06F 9/5016 711/6 |
| 2011/0239043 A1 | 9/2011 | Vedder et al. | |
| 2011/0286267 A1* | 11/2011 | Rychlik | G11C 16/10 365/185.03 |
| 2012/0102292 A1 | 4/2012 | Rajan et al. | |
| 2012/0204079 A1 | 8/2012 | Takefman et al. | |
| 2013/0042056 A1 | 2/2013 | Shats et al. | |
| 2013/0117503 A1 | 5/2013 | Nellans et al. | |
| 2013/0138874 A1 | 5/2013 | Okin et al. | |
| 2013/0246686 A1 | 9/2013 | Noborikawa et al. | |

FOREIGN PATENT DOCUMENTS

| | | |
|---|---|---|
| EP | 0664030 B1 | 5/1999 |
| EP | 1652058 | 5/2011 |
| WO | WO-2004-092904 A2 | 10/2004 |
| WO | WO-2006-122932 | 11/2006 |
| WO | PCT-2008-095201 A1 | 8/2008 |
| WO | WO-2013-016723 A2 | 1/2013 |
| WO | WO-2013-028859 A1 | 2/2013 |

OTHER PUBLICATIONS

Konstantin Shvachko et al., "The Hadoop Distributed File System", Yahoo!, 2010, pp. 1-10, http://pages.cs.wisc.edu/~akella/CS838/F15/838-CloudPapers/hdfs.pdf.*

Webopedia, "SCSI", Apr. 11, 2001, pp. 1-4, https://web.archive.org/web/20010411031801/http://www.webopedia.com/TERM/S/SCSI.html.*

Sanam Shahla Rizvi et al., "Flash SSD vs HDD: High Performance Oriented Modern Embedded And Multimedia Storage Systems", Ajou University, Korea, IEEE, 2010, pp. 1-4, http://www.academia.edu/222932/Flash_SSD_vs_HDD_High_Performance_Oriented_Modern_Embedded_and_Multimedia_Storage_Systems.*

Webopedia, "Virtual Memory", Apr. 11, 2001, pp. 1-2, https://web.archive.org/web/20010411032249/http://webopedia.com/TERM/v/virtual_memory.html.*

Webopedia, "Solid State Disk", Aug. 9, 2002, pp. 1-2, https://web.archive.org/web/20020809141838/http://www.webopedia.com/TERM/S/solid_state_disk.html.*

Webopedia, NFS, Feb. 12, 2007, pp. 1-2, https://web.archive.org/web/20070212084733/http://www.webopedia.com/TERM/N/NFS.html.*

Webopedia, "Block", Oct. 1, 2002, pp. 1-2, https://web.archive.org/web/20021001181136/http://webopedia.com/TERM/B/block.html.*

Palomar Technologies, "System on a Chip (SOC)", Apr. 14, 2011, pp. 1-2, https://web.archive.org/web/20110414082858/http://www.palomartechnologies.com/applications/system-on-a-chip/.*

Webopedia, "SOC", Aug. 3, 2004, pp. 1-2, https://web.archive.org/web/20040803113823/http://www.webopedia.com/TERM/S/SoC.html.*

Anonymous, "Solid-State Storage", Jun. 2, 2011, pp. 1-12, https://web.archive.org/web/20110602160806/http://searchstorage.techtarget.com/definition/solid-state-storage.*

Intel, "Write Combining Memory Implementation Guidelines", Nov. 1998, pp. 1-17 http://download.intel.com/design/PentiumII/applnots/24442201.pdf.*

EP Extended Search Report dated Apr. 30, 2015 re EP Appln. No. 15156155.2. 7 pages.

International Search Report and Written Opinion dated Dec. 20, 2012 in International Application No. PCT/US2012/052043. 11 pages.

International Search Report and Written Opinion dated Dec. 26, 2012 in International Application No. PCT/US2012/052000. 11 pages.

International Search Report and Written Opinion dated Dec. 27, 2012 in International Application No. PCT/US2012/052059. 12 pages.

International Search Report and Written Opinion dated Jan. 2, 2013 in International Application No. PCT/US2012/052052. 8 pages.

PCI-SIG Engineering Change Notice, "Resizable BAR Capability," Jan. 22, 2008, Updated and Approved by PWG Apr. 24, 2008, PCI Express Base Specification version 2.0. 9 pages.

Perego et al., International Application No. PCT/US12/052059 filed Aug. 23, 2012, re Response to Invitation to Correct Defects dated Oct. 17, 2012. 54 pages.

Stich, Timo, "GPU Computing on Clusters", Nvidia, Slide Show Presentation, GPU Technology Summit Israel, May 30, 2011. 28 pages.

Stuart et al., "Multi-GPU MapReduce on GPU Clusters," 2011 IEEE International Parallel & Distributed Processing Symposium, pp. 1068-1079, Oct. 11, 2009. 12 pages.

Wikipedia entry for "Serial Presence Detect", downloaded Jun. 6, 2012 from http://en.wikipedia.org/wiki/Serial_presence_detect. 20 pages.

Wikipedia entry for "Video BIOS", downloaded Jun. 6, 2012 from http://en.wikipedia.org/wiki/Video_BIOS. 1 page.

Advanced Micro Device, "Programming Guide: Amd Accelerated Parallel Processing, Open CL", rev. 1.3c, Jun. 2011. 210 pages.

EP Response with EP Appln. No. 15156155.2 filed on Jan. 6, 2016 in Response to the EP Official Communication dated Aug. 31, 2015 and the EP Search Report dated Apr. 30, 2015. 20 pages.

EP—Communication Pursuant to Article 94(3) EPC dated Aug. 1, 2016 re EP Appln. No. 15156155.2. 6 Pages.

Notification Concerning Transmittal of International Preliminary Report on Patentability dated Sep. 1, 2016 re: Int'l Appln. No. PCT/US15/016985. 7 Pages.

Keeth, Brent et al., "Dram Circuit Design Fundamental and High-Speed Topics," Book, 2008, 428 pages,John Wiley & Sons, Hoboken, New Jersey.

(56) References Cited

OTHER PUBLICATIONS

EP Response as Filed on Feb. 8, 2017 in Response to the Official Communication dated Aug. 1, 2016 re: EP Appln. No. 15156155.2. 33 Pages.

* cited by examiner

```
┌─────────────────────────────────────────────────────────┐
│ RECEIVE, AT AN INTEGRATED CIRCUIT DEVICE, A MEMORY      │
│ COMMAND FROM A MEMORY CONTROLLER CONNECTED TO           │
│    A MEMORY INTERFACE OF A MEMORY MODULE, THE           │
│   INTEGRATED CIRCUIT DEVICE HAVING A PROCESSOR, A       │
│ FIRST INTERFACE, A SECOND INTERFACE, AND NONVOLATILE    │
│     MEMORY.  THE FIRST INTERFACE CONNECTED TO A         │
│   PLURALITY OF DYNAMIC MEMORY INTEGRATED CIRCUITS.      │
│    THE SECOND FOR INTERFACE RECEIVING THE MEMORY        │
│         COMMAND FROM THE MEMORY CONTROLLER.             │
│                          1402                           │
└─────────────────────────────────────────────────────────┘
                             │
┌─────────────────────────────────────────────────────────┐
│  IN RESPONSE TO THE MEMORY COMMAND, STORE DATA IN       │
│     THE PLURALITY OF DYNAMIC MEMORY INTEGRATED          │
│                       CIRCUITS                          │
│                         1404                            │
└─────────────────────────────────────────────────────────┘
                             │
┌─────────────────────────────────────────────────────────┐
│   IN RESPONSE TO A COMMAND FROM THE PROCESSOR,          │
│  STORE DATA IN AT LEAST ONE NONVOLATILE MEMORY          │
│             INTEGRATED CIRCUIT DEVICE                   │
│                        1406                             │
└─────────────────────────────────────────────────────────┘
```

FIGURE 14

```
┌─────────────────────────────────────────────────┐
│  RECEIVE, AT AN INTEGRATED CIRCUIT DEVICE, A    │
│  MEMORY COMMAND FROM A MEMORY CONTROLLER        │
│  CONNECTED TO A MEMORY INTERFACE OF A MEMORY    │
│  MODULE, THE INTEGRATED CIRCUIT DEVICE HAVING A │
│  SOLID-STATE DISK CONTROLLER CIRCUIT, A FIRST   │
│  INTERFACE, A SECOND INTERFACE, AND A THIRD     │
│  INTERFACE. THE FIRST INTERFACE CONNECTED TO A  │
│  PLURALITY OF DYNAMIC MEMORY INTEGRATED         │
│  CIRCUITS. THE SECOND INTERFACE CONNECTED TO    │
│  AT LEAST ONE NONVOLATILE MEMORY INTEGRATED     │
│  CIRCUIT DEVICE, THE THIRD INTERFACE RECEIVING  │
│  THE MEMORY COMMAND FROM THE MEMORY             │
│  CONTROLLER                                     │
│                     1502                        │
└─────────────────────────────────────────────────┘
                         │
┌─────────────────────────────────────────────────┐
│   IN RESPONSE TO THE MEMORY COMMAND, STORE      │
│   DATA IN THE PLURALITY OF DYNAMIC MEMORY       │
│              INTEGRATED CIRCUITS                │
│                     1504                        │
└─────────────────────────────────────────────────┘
                         │
┌─────────────────────────────────────────────────┐
│  IN RESPONSE TO A COMMAND FROM THE SOLID-STATE  │
│  DISK CONTROLLER CIRCUIT, STORE DATA IN THE AT  │
│  LEAST ONE NONVOLATILE MEMORY INTEGRATED        │
│                 CIRCUIT DEVICE                  │
│                     1506                        │
└─────────────────────────────────────────────────┘
```

FIGURE 15

DISTRIBUTED PROCEDURE EXECUTION AND FILE SYSTEMS ON A MEMORY INTERFACE

CROSS-REFERENCE TO RELATED APPLICATIONS

The present application claims the benefit of U.S. Provisional Application Ser. No. 61/788,196, filed Mar. 15, 2013, and titled METHODS AND SYSTEMS THAT COMMUNICATE VIA A MEMORY MODULE INTERFACE, and claims the benefit of U.S. Provisional Application Ser. No. 61/732,898, filed Dec. 3, 2012, and titled METHODS AND SYSTEMS FOR SUPPORTING FUNCTIONS ON A LEGACY MEMORY INTERFACE, and claims the benefit of U.S. patent application Ser. No. 14/064,167, filed Oct. 27, 2013, and titled COMMUNICATION VIA A MEMORY INTERFACE, and claims the benefit of U.S. Provisional Application Ser. No. 61/526,953, filed Aug. 24, 2011, and titled METHODS AND SYSTEMS FOR MAPPING A PERIPHERAL FUNCTION ONTO A LEGACY MEMORY INTERFACE, and claims the benefit of U.S. Provisional Application Ser. No. 61/647,986, filed May 16, 2012, and titled METHODS AND SYSTEMS FOR MAPPING A PERIPHERAL FUNCTION ONTO A LEGACY MEMORY INTERFACE, and claims the benefit of U.S. Provisional Application Ser. No. 61/670,874, filed Jul. 12, 2012, and titled METHODS AND SYSTEMS FOR MAPPING A PERIPHERAL FUNCTION ONTO A LEGACY MEMORY INTERFACE, and claims the benefit of U.S. Provisional Application Ser. No. 61/691,134, filed Aug. 20, 2012, and titled METHODS AND SYSTEMS FOR MAPPING A PERIPHERAL FUNCTION ONTO A LEGACY MEMORY INTERFACE, and claims the benefit of International Application PCT/US12/52000, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52043, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52052, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52059, filed Aug. 23, 2012, and titled METHODS AND SYSTEMS FOR MAPPING A PERIPHERAL FUNCTION ONTO A LEGACY MEMORY INTERFACE, all eleven of which are hereby incorporated herein by reference for all purposes.

BRIEF DESCRIPTION OF THE DRAWINGS

FIG. 14 is a flowchart illustrating a method of operating a memory module.

FIG. 15 is a flowchart illustrating a method of operating a memory module.

DETAILED DESCRIPTION OF THE EMBODIMENTS

In an embodiment, nonvolatile memory (e.g., flash memory, solid-state disk) are included on memory modules that are on a DRAM memory channel. This helps the high capacity storage offered by nonvolatile memories to reside closer to the compute resources (i.e., CPU) of a system. In addition, the CPU and the nonvolatile memory can pass commands and/or data (possibly via a controller) using the relatively high bandwidth of the DRAM memory channel.

Nonvolatile memory residing on a DRAM memory channel can be integrated into the existing file system structures of popular operating systems to facilitate adoption into popular programming paradigms. One such method of integration is to have the nonvolatile memory residing on a DRAM memory channel presented as part of, or all of, a distributed file system. For example, popular operating systems may be modified to present the nonvolatile memory residing on a DRAM memory channel as part of a network file system (NFS), Hadoop file system, and/or other distributed file systems (DFS). Remote procedure call (RPC) requests and/or requests originating from the local CPU (whether using the RPC mechanism/software layers, or another method), or information associated with local request and/or RPCs, may be routed to the memory modules over the DRAM memory channel in order to service compute and/or DFS commands.

Figure 22A:
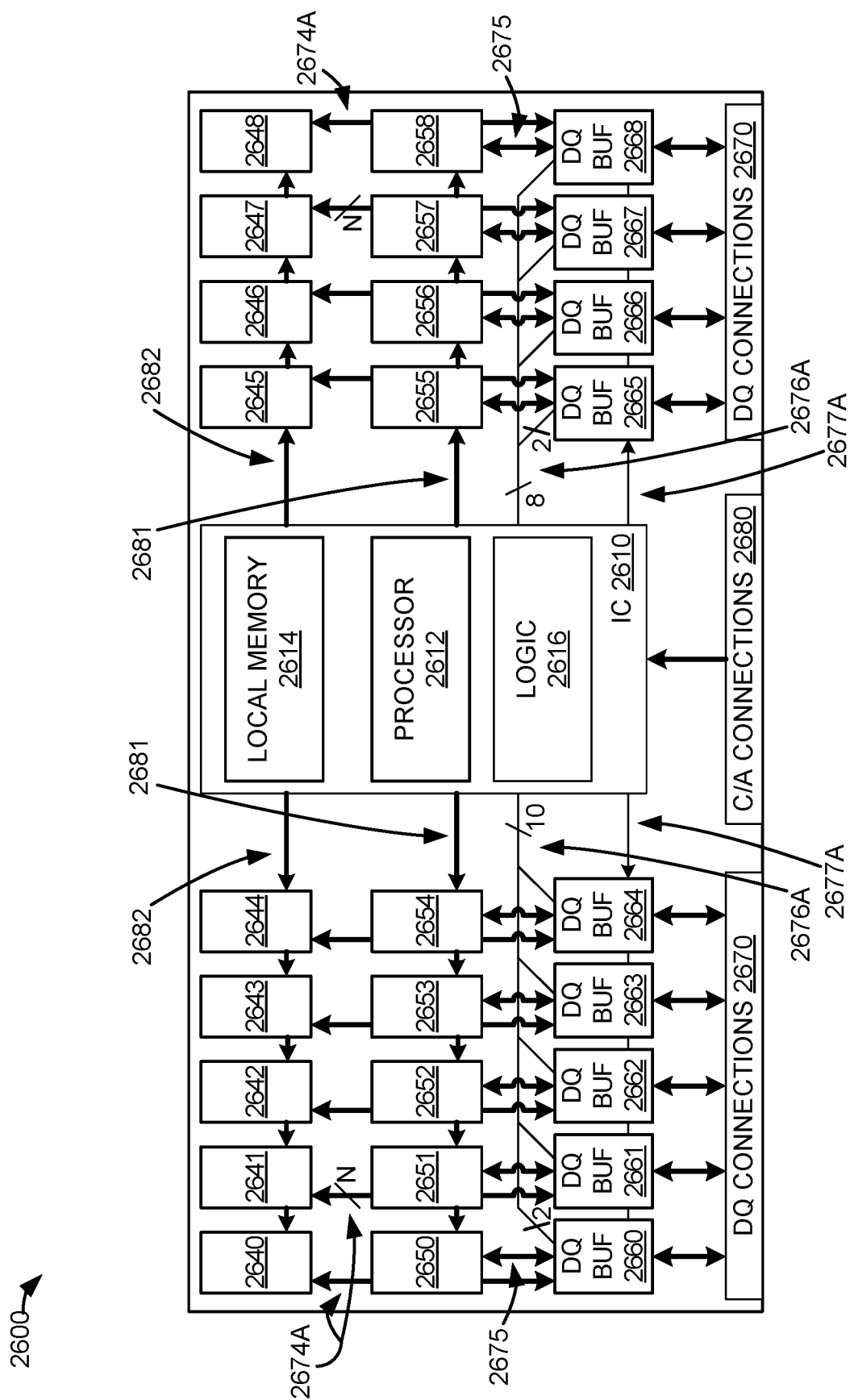
FIG. 22A is a block diagram illustrating a compute accelerated memory module.

FIG. 22A is a block diagram illustrating a compute accelerated memory module. FIG. 23A is a block diagram illustrating further detail of a compute accelerated memory module. Memory module 2600 comprises integrated circuit (IC) 2610, first rank of memory 2640-2648, second rank of memory 2650-2658, DQ buffers 2660-2668, DQ connections 2670, and command/address (C/A) connections 2680. IC 2610 can include local memory 2614, processor 2612, and logic 2616. In FIGS. 22A-22C and FIGS. 23A-23C local memory 2614 is shown as part of IC 2610. However, it should be understood that in some embodiments local memory 2614 may not be part of IC 2610. Local memory 2614 may comprise an integrated circuit(s) or module(s) (discrete parts or through-silicon-via memory stack) separate from IC 2610. Local memory 2614 may be, for example, stacked with IC 2610. Similarly, first rank of memory 2640-2648 and/or second rank of memory 2650-2658 may be, or comprise, stacked integrated circuits or integrated circuit packages.

In the configuration shown in FIG. 22A and FIG. 23A, C/A signals received at C/A connections 2680 are buffered by IC 2610 and sent to memories 2650-2658 via links 2681. C/A signals received at C/A connections 2680 are also buffered by IC 2610 and sent to memories 2640-2648 via links 2682. Thus, IC 2610 necessarily includes command/address interfaces (not explicitly shown in FIG. 22A) configured to connect to memories 2640-2648 and memories 2650-2658. DQ signals received/sent by DQ buffers 2660-2668 from DQ connections 2670 are sent/received to/from memories 2650-2658 via N bit wide links 2675. DQ signals received/sent by DQ buffers 2660-2668 from DQ connections 2670 are sent/received to/from memories 2640-2648 via N bit wide links 2674A. DQ signals received/sent by DQ buffers 2660-2668 from DQ connections 2670 are sent/received to/from IC 2610 via high speed unidirectional serial links 2676A. There are two serial links 2676A per DQ buffer 2660-2668—one for sending data to IC 2610, and one for receiving data from IC 2610. In an embodiment, these serial links 2676A operate at N times the rate of DQ connections 2670. In another embodiment, these serial links 2676A operate at M times the rate of DQ connections 2670, where M<=N. Thus, for example, when N=8 and M=8, the serial links 2676A are able to send/receive data to/from IC 2610 at the same rate data is being sent/received by memories 2640-2648 and 2650-2658. DQ buffers 2660-2668 may be controlled by IC 2610 to send/receive data on links 2676A and/or capture DQ data by one or more buffer control signals 2677A.

Processor 2612 can communicate with a memory controller by emulating a range of memory (i.e., an aperture) as described previously. Processor 2612 (or IC 2610) can send/receive data via links 2676A and the DQ connections 2670 to/from the memory controller.

Two unidirectional (one read data, one write data) high-speed serial connections between the DQ buffers 2660-2668 and IC 2610 provide for communication between the memory controller and IC 2610. This allows data captured by the DQ buffers (registers) 2660-2668 to be sent/received in parallel to the memory ranks 2640-2648 and 2650-2658 while being simultaneously sent/received to/from IC 2610 via the serial links 2676A. The serial links 2676A operate at, for example, 8 times the rate of the DQ links 2674A and 2675 to the memories 2640-2648 and 2650-2658. Serial links 2676A may operate at, for example, 8× the DDR3 rate in order to transfer to the processor, in the same amount of time as it would take to complete a transfer to memory, the 8 bits being transferred to/from the memory controller. In various embodiments, serial links 2676A may operate at other multipliers (e.g., 4× or 16×) and at, or more than, the data rates of other memory technologies mentioned herein (e.g., DDR4, DDR5, etc.) In FIG. 22A and FIG. 23A, all of the memory ranks 2640-2648 and 2650-2658 are configured as operating system (OS) visible memory. Processor 2612 can use local memory 2614 to perform its assigned tasks and/or as a cache for one or both of memory ranks 2640-2648 and 2650-2658.

In an embodiment, it should be understood that memory module 2600 includes a memory interface (e.g., C/A connections 2680) configured to interface to a memory controller. Memory module 2600 includes an integrated circuit device (e.g., IC 2610) that is coupled to the memory interface. The integrated circuit device includes a processor (e.g., processor 2612), a first command/address interface coupled to the processor and configured to connect to a first plurality of dynamic memory integrated circuits (e.g., the interface coupled to links 2681), and a second command/address interface coupled to the processor and configured to connect to a second plurality of dynamic memory integrated circuits (e.g., the interface coupled to links 2682).

Memory module 2600 also includes the first plurality of dynamic memory integrated circuits (e.g., memories 2650-2658), the second plurality of dynamic memory integrated circuits (e.g., memories 2640-2648), and at least one data buffer integrated circuit (e.g., one or more of DQ buffers 2660-2668). The first plurality of dynamic memory integrated circuits are coupled to the first command/address interface (e.g., by links 2681). The second plurality of dynamic memory integrated circuits are coupled to the second command/address interface (e.g., by links 2682). The at least one data buffer integrated circuit is coupled to the first plurality of dynamic memory integrated circuits (e.g., by links 2674A) and the second plurality of dynamic memory integrated circuits (e.g., by links 2675). The at least one data buffer integrated circuit is coupled to the memory interface (e.g., DQ connections 2670). The at least one data buffer integrated circuit are each coupled to the integrated circuit device by at least a read serial link and a write serial link (e.g., links 2676A).

DQ buffers 2660-2668 may communicate data from the integrated circuit device in response to a transaction on the memory interface that is directed to a memory aperture associated with IC 2610 (for example, as described previously DQ buffers 2660-2668 may transfer data to and from memories 2650-2658 and 2640-2648 at a first information rate (e.g., the DDR3—or other memory technology mentioned herein—byte rate) and links 2676A may be configured to transfer data to and from IC 2610 at a second information rate that is at least the first information rate (e.g., the DDR3—or other memory technologies mentioned herein—byte rate or higher—or equivalently, a bit rate of 8× the DDR3 byte rate, or higher). Links 2676A may be serial links, or may have a width greater than one bit so long as the second information rate of links 2676A is at least the first information rate. IC 2610 may include a local memory interface that is coupled to processor 2612. This local memory interface may be coupled to at least one integrated circuit memory device (e.g., local memory 2614). It should also be understood that, in some embodiments, links 2676A can use single-ended signaling and other embodiments use differential signaling. Likewise, in some embodiments, links 2676A can be unidirectional and in other embodiments links 2676A can be bidirectional.

In another embodiment, an integrated circuit device (e.g., IC 2610) may receive, from a memory interface (e.g., C/A connections 2680), a first memory command directed to a first rank of dynamic memory integrated circuit devices disposed on the memory module (e.g., a read command directed to an address stored in memories 2640-2648). The integrated circuit device can include a processor (e.g., processor 2612). For example, IC 2610 may receive, via C/A connections 2680, a memory read command from a memory controller. This memory read command may select memories 2640-2648. IC 2610 may relay this command to memories 2640-2648 thereby initiating a read burst from memories 2640-2648.

In response to the first memory command, data from the first rank of dynamic memory integrated circuit devices that is associated with the first memory command is stored in at least one data buffer integrated circuit. For example, in response to a read command directed to an address stored in memories 2640-2648, DQ buffers 2660-2668 may latch (store) the read data output by memories 2640-2648 as a response to the read command (as relayed by IC 2610).

Under the control of the integrated circuit device, the data associated with the first memory command is communicated from the at least one data buffer integrated circuit to the memory interface such that the first rank of dynamic memory integrated circuit devices are accessible to the memory controller. For example, IC 2610 may use one or more buffer control signals 2677A to cause DQ buffers 2660-2668 to output the read data they latched onto DQ connections 2670. The memory controller can receive this read data from DQ buffers 2660-2668 thereby completing a read access, of memories 2640-2648, by the memory controller.

The integrated circuit device may receive, from the memory interface, a second memory command directed to the first rank of dynamic memory integrated circuit devices (e.g., a second read command directed to an address stored in memories 2640-2648). This memory read command may or may not select memories 2640-2648. IC 2610 may optionally relay this command to memories 2640-2648 thereby initiating a read burst from memories 2640-2648. IC 2610 may, for example, intercept this read command and not relay it to memories 2640-2648. This may reduce power consumption. IC 2610 may use the memory cycles associated with this command for its own purposes.

In response to the second memory command, data from the integrated circuit that is associated with the second memory command is stored in at least one data buffer integrated circuit. For example, in response to a read command directed to an aperture associated with IC 2610, IC 2610 may send, via links 2676A, data to DQ buffers 2660-2668 to be latched (stored).

Under the control of the integrated circuit device, the data associated with the second memory command is communicated from the at least one data buffer integrated circuit to the memory interface such that data processed by the processor is accessible to the memory controller. For example, IC 2610 may use one or more buffer control signals 2677A to cause DQ buffers 2660-2668 to output, on DQ connections 2670, the data received from IC 2610 via links 2676A. This data may have been processed by processor 2612. The memory controller can receive this read data from DQ buffers 2660-2668 thereby completing a read access, by the memory controller, of the aperture associated with IC 2610 (and thereby also associated with processor 2612).

The integrated circuit device may also control the at least one data buffer integrated circuit to communicate the data associated with the first memory command to the integrated circuit. For example, IC 2610 may use one or more buffer control signals 2677A to cause DQ buffers 2660-2668 to output the read associated with the first memory command onto one or more links 2676A. In this manner, IC 2610 can "snoop" all or part of the data associated with memory transactions that read memories 2640-2648. In other words, IC 2610 can see and/or capture all or part of the data associated with memory transactions that read memories 2640-2648 so that IC 2610 may use this data and/or memory transactions for its own purposes independent of the data stored in memories 2640-2648. For example, snooping may be used for cache-coherency. Typical programs and data that may be used by processor 2612 may exhibit spatial and temporal locality. Thus, using local memory 2614 as a cache for dedicated dynamic memory may provide a performance benefit.

The integrated circuit device may also be coupled to a memory that its processor uses as a local memory or cache. This cache may be used to cache data stored in the first rank of dynamic memory integrated circuit devices. The data supplied to the at least one data buffer integrated circuit may have been stored in this local memory (or cache) prior to being sent by the integrated circuit device to the at least one data buffer integrated circuit. For example, IC 2610 may satisfy the read of the aperture associated with IC 2610 using data that was stored in local memory 2614 at one time or another prior to the read of the aperture by the memory controller. Similar to the access steps described above, a third memory command may cause data stored in a second rank of dynamic memory integrated circuit devices to be stored in the at least one data buffer integrated circuit. For example, data stored in memories 2650-2658 may be read by the memory controller using similar steps to previously described for accessing (and snooping) memories 2640-2648.

A write to the first rank of dynamic memory integrated circuit devices is performed in a similar manner to a read, except with the data flows reversed. In other words, to perform a write to memories 2640-2648: (1) a write command is received by IC 2610 via C/A connections 2680 and relayed to memories 2640-2648; (2) the write data is latched from DQ connections 2670 into DQ buffers 2660-2668; and, (3) the write data is communicated to memories 2640-2648 via links 2674A at the appropriate time. Likewise, a write to the aperture associated with the integrated circuit device is performed in a similar manner to a read with the data flows reversed. In other words, to perform a write to the aperture associated with IC 2610: (1) a write command is received by IC 2610 via C/A connections 2680 and may optionally be relayed to memories 2640-2648; (2) the write data is latched from DQ connections 2670 into DQ buffers 2660-2668; and, (3) the write data is communicated to IC 2610 via links 2676A. This write operation gives processor 2612 and any other part of IC 2610 access to data being written to the aperture associated with IC 2610. IC 2610 can also snoop data being written to memories 2640-2648. In other words, IC 2610 can see and/or capture all or part of the data associated with memory transactions that write memories 2640-2648 so that IC 2610 may use this data and/or memory transactions for its own purposes independent of the data stored (or being stored) in memories 2640-2648.

Figure 22B:
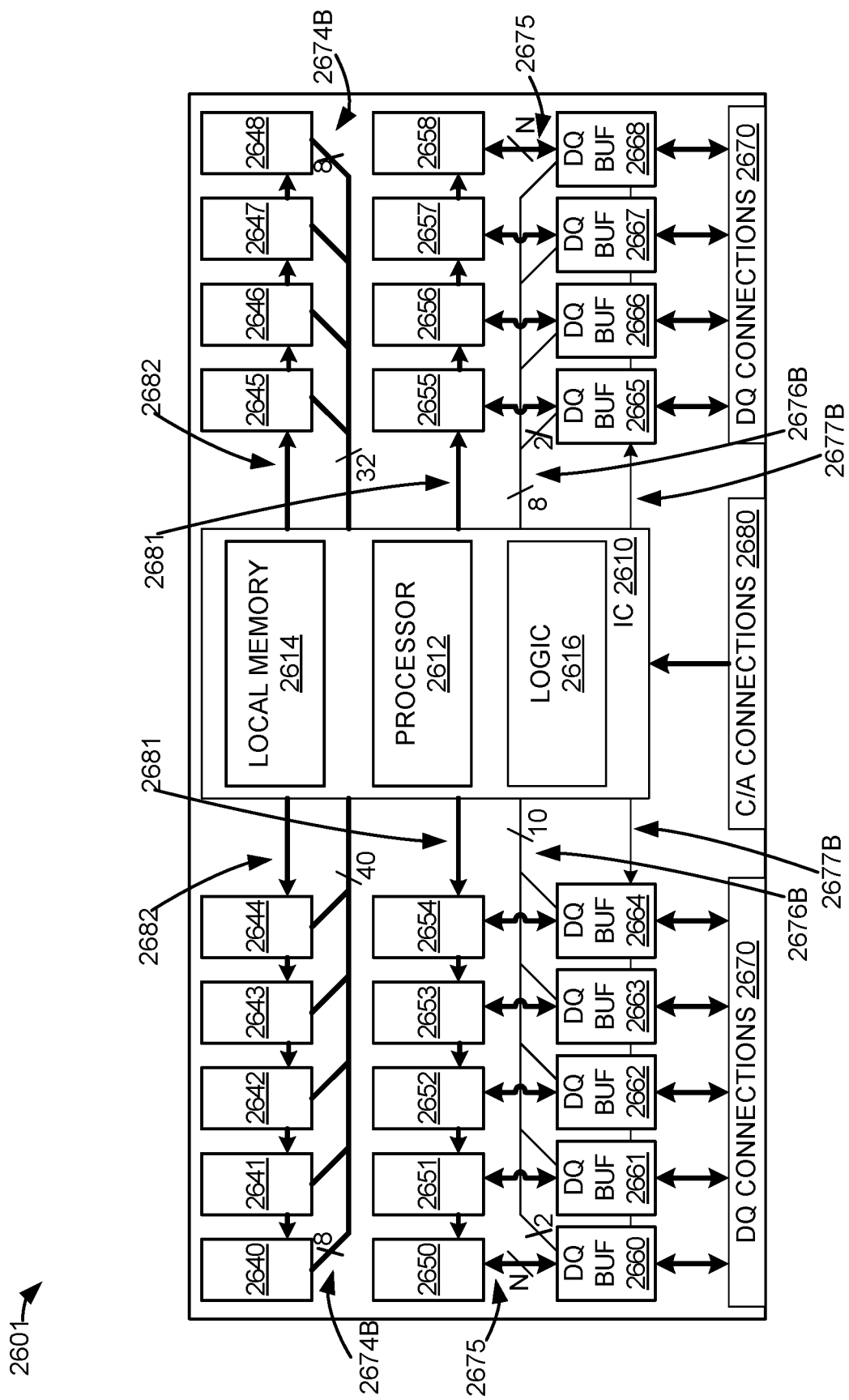
FIG. 22B is a block diagram illustrating a compute accelerated memory module with dedicated memory.
Figure 23A:
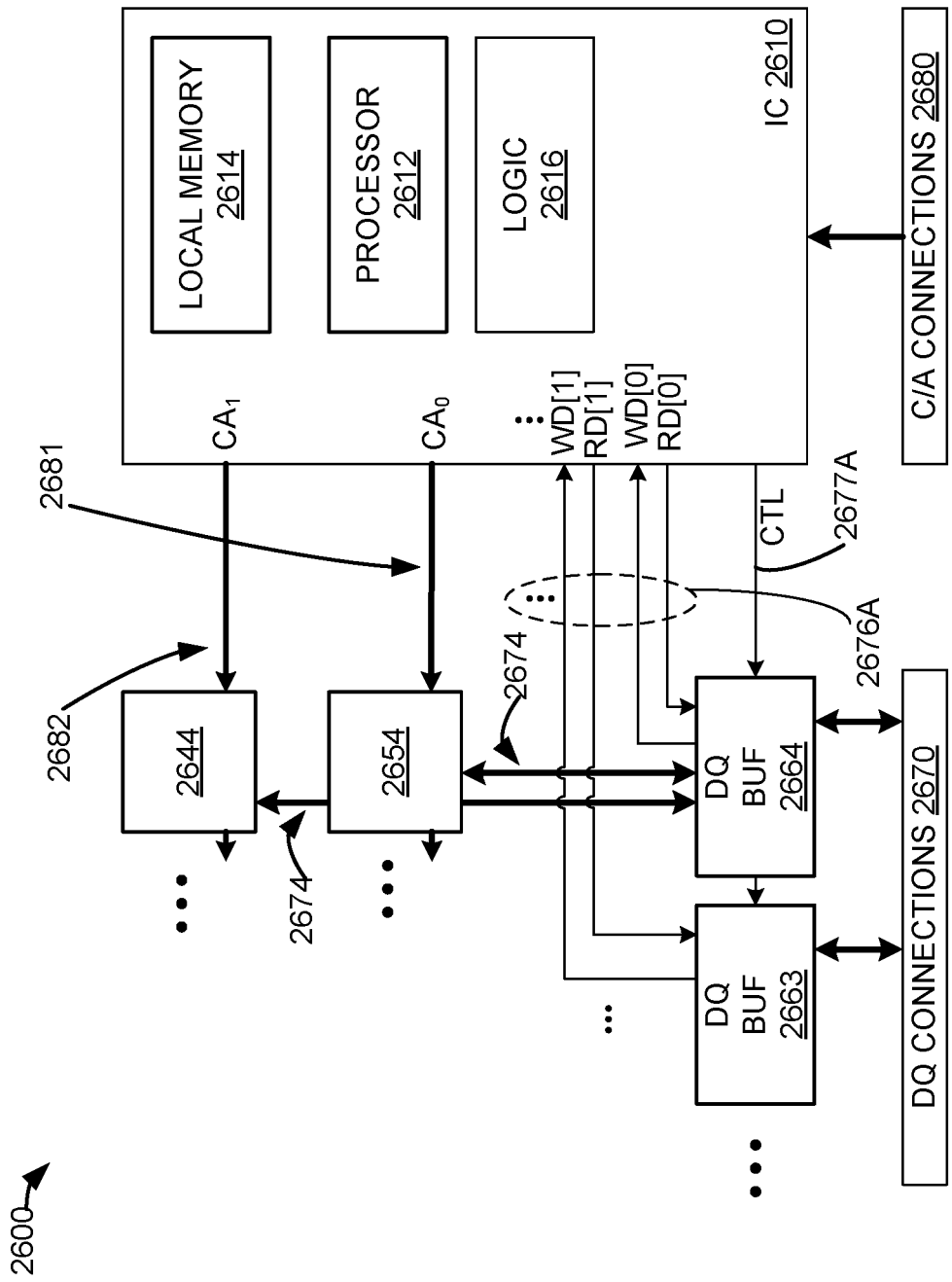
FIG. 23A is a block diagram illustrating further detail of a compute accelerated memory module.
Figure 23B:
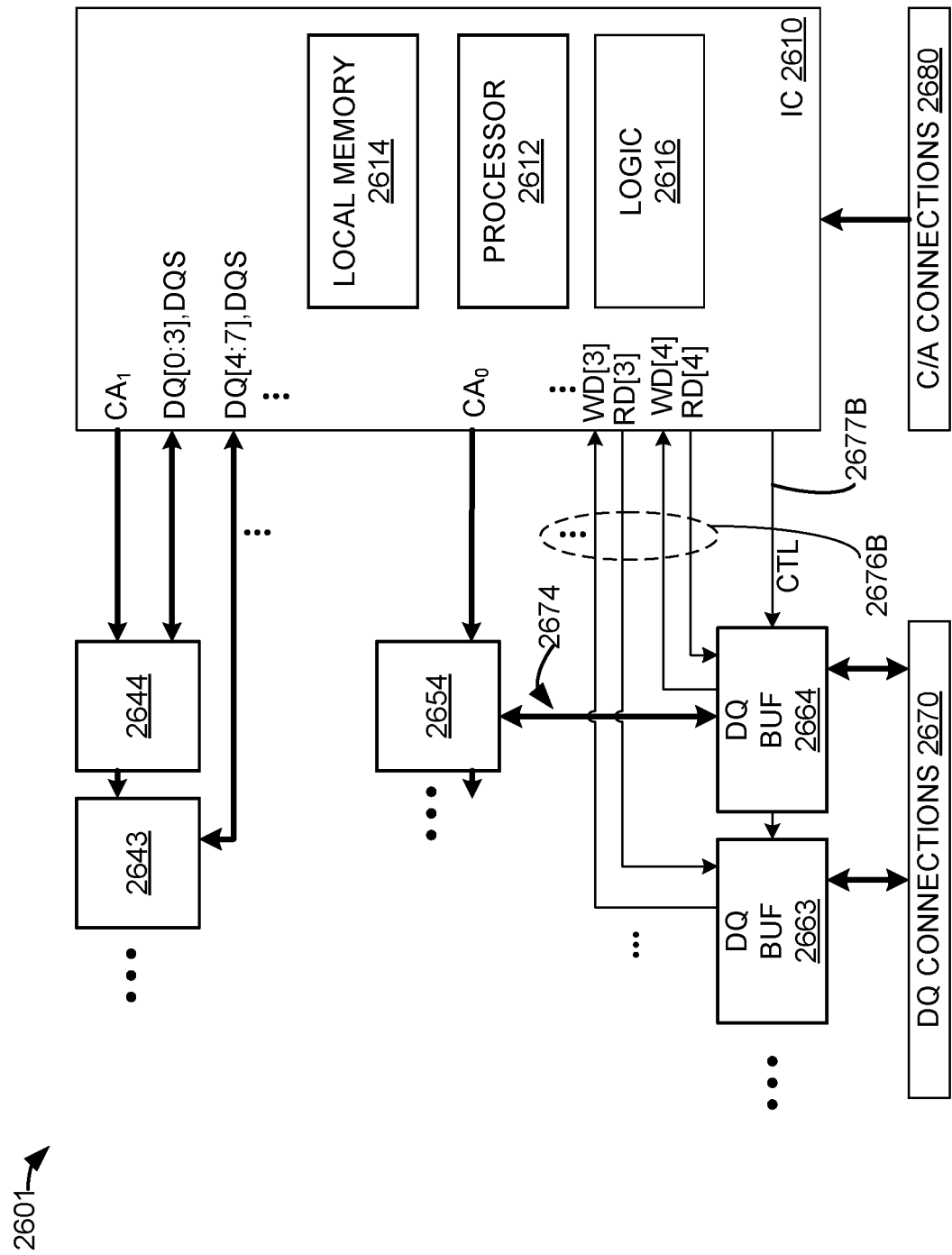
FIG. 23B is a block diagram illustrating further detail of a compute accelerated memory module with dedicated memory.

FIG. 22B is a block diagram illustrating a compute accelerated memory module with dedicated memory. FIG. 23B is a block diagram illustrating further detail of a compute accelerated memory module with dedicated memory. Memory module 2601 illustrated in FIG. 22B and FIG. 23B may be used as one or more of memory modules 2620 and/or memory modules 2625, discussed herein. Memory module 2601 comprises IC 2610, first rank of memory 2640-2647, second rank of memory 2650-2658, DQ buffers 2660-2668, DQ connections 2670, and C/A connections 2680. IC 2610 can include local memory 2614, processor 2612, and logic 2616.

In the configuration shown in FIG. 22B and FIG. 23B, C/A signals received at C/A connections 2680 are buffered by IC 2610 and sent to memories 2650-2658 via links 2681. C/A signals received at C/A connections 2680 can be buffered by IC 2610 and sent to memories 2640-2648 via links 2682. C/A signals sent to memories 2640-2648 via links 2682 can also be internally generated by IC 2610 so that processor 2612 can directly access memories 2640-2648. DQ signals received/sent by DQ buffers 2660-2668 from DQ connections 2670 are sent/received to/from memories 2650-2658 via N bit wide links 2675.

DQ signals received/sent by DQ buffers 2660-2668 from DQ connections 2670 are sent/received to/from IC 2610 via high speed unidirectional serial links 2676B. There are two serial links 2676B per DQ buffer 2660-2668—one for sending data to IC 2610, and one for receiving data from IC 2610. In an embodiment, these serial links 2676B operate at N times the rate of DQ connections 2670. In another embodiment, these serial links 2676B operate at M times the rate of DQ connections 2670, where M<=N. Thus, for example, when N=8 and M=8, the serial links 2676B are able to send/receive data to/from IC 2610 at the same rate data is being sent/received by memories 2650-2658. DQ signals received/sent by IC 2610 from/to DQ buffers 2660-2668 can be sent/received to/from memories 2640-2648 in parallel. Internally generated DQ signals (i.e., data bound from/to processor 2612) sent/received by IC 2610 can be sent/received to/from memories 2640-2648 in parallel via links 2674B. Accordingly, memories 2640-2648 can be configured to operate as processor memory. DQ buffers 2660-2668 may be controlled by IC 2610, using one or more buffer control signals 2677B, to send/receive data on link 2676B and/or capture DQ data.

Processor 2612 can communicate with a memory controller by emulating a range of memory (i.e., an aperture). The memory controller can communicate with memories 2640-2648 via IC 2610. The memory controller can communicate data to memories 2640-2648 via a broadcast write received by IC 2610. The broadcast write data can be received by IC 2610 via DQ buffers 2660-2668 as describe previously. Processor 2612 (or IC 2610) can send/receive data via DQ connections 2670 to/from the memory controller. C/A connections 2680 can be buffered by IC 2610 and distributed separately to each rank 2640-2648 and 2650-2658.

Thus it can be seen in FIG. 22B and FIG. 23B a first rank of memory 2640-2648 on memory module 2601 is connected in parallel (i.e., ×8) to IC 2610 (and thereby coupled in parallel to processor 2612). This first rank 2640-2648 may act as dedicated memory for processor 2612 (i.e., like processor memory). A second rank 2650-2658 is connected in parallel to the DQ buffers 2660-2668 to act as operating system (OS) visible memory (i.e., like CPU memory). In this solution, one of the memory ranks 2650-2658 is configured as OS visible memory. A second of the memory ranks 2640-2648 is configured as memory dedicated for use by IC 2610. Processor 2612 may also use local memory 2614 to perform its assigned tasks.

Two unidirectional (one read data, one write data) high-speed serial connections between the DQ buffers 2660-2668 and IC 2610 provide for communication between the memory controller and IC 2610. This allows data captured by the DQ buffers (registers) 2660-2668 to be sent/received in parallel to/from memories 2650-2658 (i.e., the CPU memory rank) while being simultaneously sent/received to/from IC 2610 (and thereby processor 2612) via serial links 2676B. Serial links 2676B can operate at, for example, 8 times the clock rate of the DQ links 2675 to the memories 2650-2658. It should also be understood that, in some embodiments, links 2676B can use single-ended signaling and other embodiments use differential signaling. Likewise, in some embodiments, links 2676B can be unidirectional and in other embodiments links 2676B can be bidirectional.

In an embodiment, it should be understood that memory module 2601 includes a memory interface (e.g., C/A connections 2680) configured to interface to a memory controller. Memory module 2601 includes an integrated circuit device (e.g., IC 2610) that is coupled to the memory interface. The integrated circuit device includes a processor (e.g., processor 2612), a first command/address interface coupled to the processor (e.g., the interface coupled to links 2682) and a first data interface (e.g., the interface coupled to links 2674B). The first command/address interface and the first data interface are configured to connect to a first plurality of dynamic memory integrated circuits. The integrated circuit device also includes a second command/address interface coupled to the processor and configured to connect to a second plurality of dynamic memory integrated circuits (e.g., the interface coupled to links 2681).

Memory module 2601 also includes the first plurality of dynamic memory integrated circuits (e.g., memories 2640-2648), the second plurality of dynamic memory integrated circuits (e.g., memories 2650-2658), and at least one data buffer integrated circuit (e.g., one or more of DQ buffers 2660-2668). The first plurality of dynamic memory integrated circuits are coupled to the first command/address interface (e.g., by links 2682). The first plurality of dynamic memory integrated circuits are also coupled to the first data interface (e.g., by links 2674B). The second plurality of dynamic memory integrated circuits are coupled to the second command/address interface (e.g., by links 2681). Because the DQ pins of the first plurality of dynamic memory integrated circuits are coupled to the first data interface, the first plurality of dynamic memory integrated circuits are not directly accessible to a memory controller. However, because the DQ pins of the first plurality of dynamic memory integrated circuits are coupled to the first data interface, the first plurality of dynamic memory integrated circuits are directly accessible by IC 2610 (and thereby directly accessible by processor 2612).

The at least one data buffer integrated circuit is coupled to the second plurality of dynamic memory integrated circuits (e.g., by links 2675). The at least one data buffer integrated circuit is coupled to the memory interface (e.g., DQ connections 2670). The at least one data buffer integrated circuits are each coupled to the integrated circuit device by at least a read serial link and a write serial link (e.g., links 2676B).

The at least one data buffer integrated circuit may communicate data from the integrated circuit device in response to a transaction on the memory interface that is directed to a memory aperture associated with the integrated circuit device (for example, as described previously). The at least one data buffer integrated circuit may transfer data to and from memories 2650-2658 at a first information rate (e.g., the DDR3 byte rate) and the links 2676B may be configured to transfer data to and from the integrated circuit device at a second information rate that is at least the first information rate (i.e., the DDR3 byte rate or higher—or equivalently, a bit rate of 8× the DDR3 byte rate, or higher). In various embodiments, serial links 2676B may operate at other multipliers (e.g., 4× or 16×) and at, or more than, the data rates of other memory technologies mentioned herein (e.g., DDR4, DDR5, etc.) The links 2676B may be serial links, or may have a width greater than one bit so long as the second information rate of the links 2676B is at least the first information rate. The integrated circuit device may include a local memory interface that is coupled to the processor. This local memory interface may be coupled to at least one integrated circuit memory device.

In an embodiment, memory module 2601 may be operated similar to memory module 2600 to read and write data from a first memory rank (e.g., memories 2650-2658). However, because DQ signals of the second rank of memory (e.g., memories 2640-2648) on memory module 2601 are directly coupled to the integrated circuit device (e.g., IC 2610), IC 2610 (and thereby processor 2612) can directly access (i.e., read and write) the second rank of memory without the intermediate step of storing the data the at least one data buffer integrated circuit (e.g., DQ buffers 2660-2668). Thus, the second rank of memory may be referred to as being "dedicated" to the processor while the first rank of memory operates in a "standard" fashion.

Figure 22C:
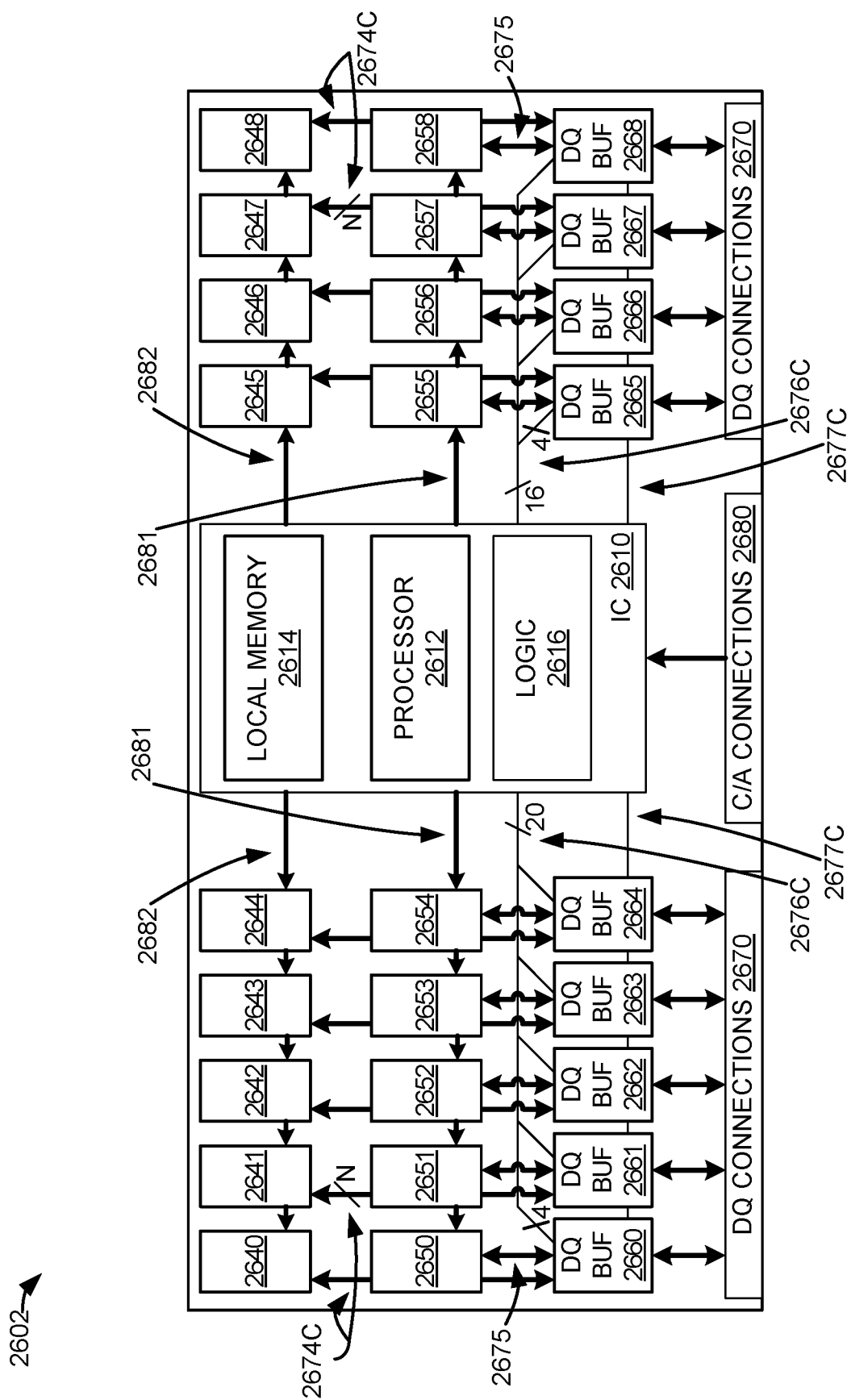
FIG. 22C is a block diagram illustrating a compute accelerated memory module with flexible memory.
Figure 23C:
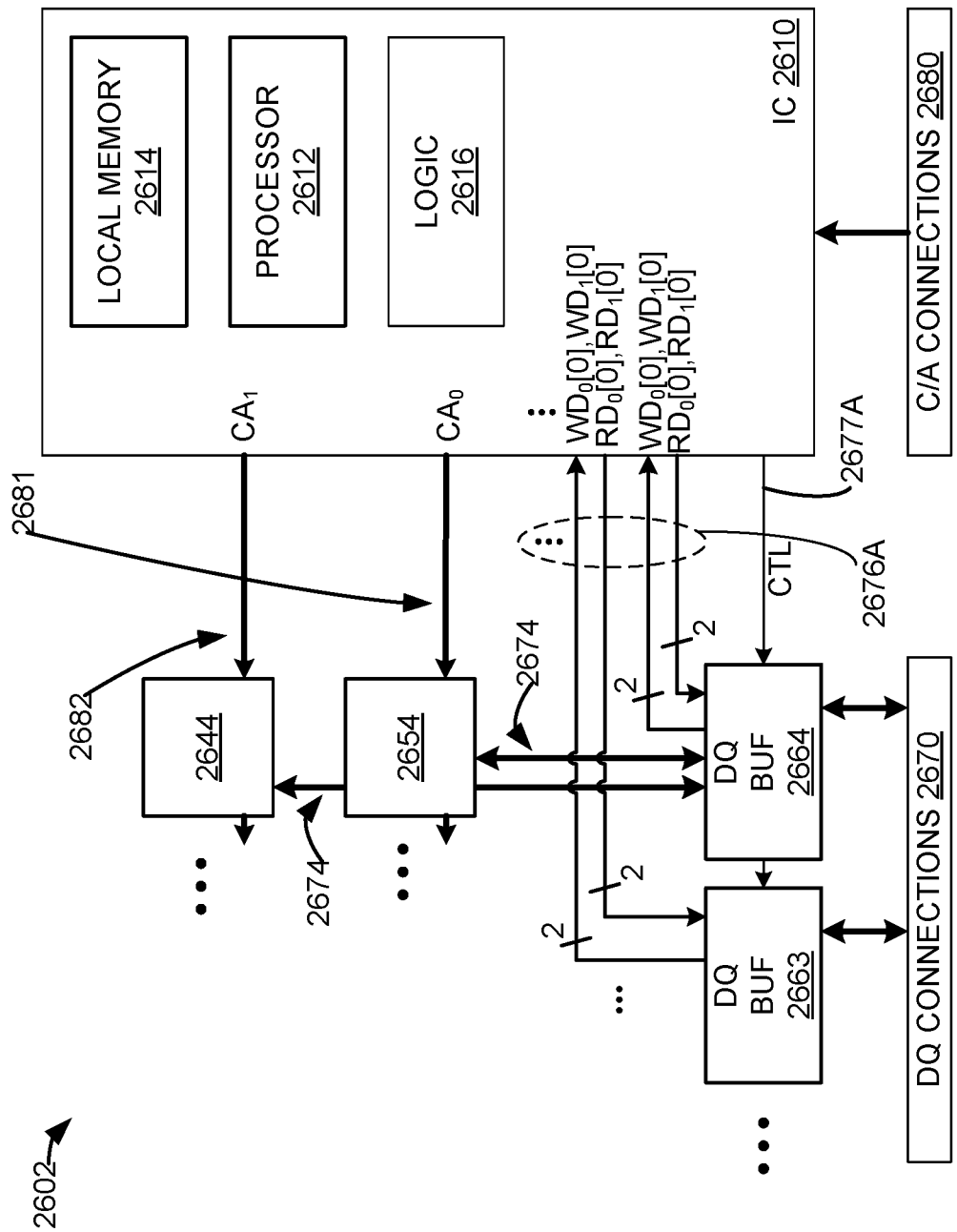
FIG. 23C is a block diagram illustrating further detail of a compute accelerated memory module with flexible memory.

FIG. 22C is a block diagram illustrating a compute accelerated memory module with flexible memory. FIG. 23C is a block diagram illustrating further detail of a compute accelerated memory module. Memory module 2602 comprises IC 2610, first rank of memory 2640-2648, second rank of memory 2650-2658, DQ buffers 2660-2668, DQ connections 2670, and C/A connections 2680. IC 2610 can include local memory 2614, processor 2612, and logic 2616.

In the configuration shown in FIG. 22C and FIG. 23C, C/A signals received at C/A connections 2680 are buffered by IC 2610 and sent to memories 2650-2658 via links 2681. C/A signals received at C/A connections 2680 can be buffered by IC 2610 and sent to memories 2640-2648 via links 2682. C/A signals sent to memories 2640-2648 via links 2682 can also be internally generated by IC 2610 so that processor 2612 can access memories 2640-2648. DQ signals received/sent by DQ buffers 2660-2668 from DQ connections 2670 are sent/received to/from memories 2650-2658 via N bit wide links. DQ signals received/sent by DQ buffers 2660-2668 from DQ connections 2670 and/or IC 2610 are sent/received to/from memories 2640-2648 via N bit wide links 2674A. DQ signals received/sent by DQ buffers 2660-2668 from DQ connections 2670 and/or memories 2640-2648 are sent/received to/from IC 2610 via high speed unidirectional serial links 2676C. In an embodiment, there are four serial links 2676C per DQ buffer 2660-2668—two for sending data to IC 2610, and two for receiving data from IC 2610. These serial links 2676C operate at, for example, at least N times the rate of DQ connections 2670. Thus, for example, when N=8, the serial links 2676C are able to send/receive data to/from IC 2610 at least the same rate, or faster, than data is being simultaneously sent/received by DQ connections 2670 and memories 2640-2648.

Processor 2612 can communicate with a memory controller by emulating a range of memory (i.e., an aperture). Processor 2612 (or IC 2610) can send/receive data via the DQ lines to/from the memory controller. C/A signal lines 2680 can be buffered by IC 2610 and distributed separately to each rank 2640-2648 and 2650-2658. C/A signals 2682 can be internally generated by IC 2610 so that processor 2612 can access memories 2640-2648.

In this configuration, one of the memory ranks 2650-2658 is configured as OS visible memory. A second of the memory ranks 2640-2648 can be configured as memory dedicated for use by IC 2610, or as OS visible memory. Processor 2612 may also use local memory 2614 to perform its assigned tasks.

Two unidirectional (one read data, one write data) high-speed serial connections between DQ buffers 2660-2668 and the processor can provide for communication between the memory controller and IC 2610. Two additional unidirectional (one read data, one write data) high-speed serial connections between DQ buffers 2660-2668 and IC 2610 can provide for communication between processor 2612 and the dedicated memory rank 2640-2648 (if so configured). The additional high-speed serial connections can be made possible by repurposing IC 2610 pins that served as DQ pins for the dedicated memory configuration. It be understood that, in some embodiments, links 2676C can use single-ended signaling and other embodiments use differential signaling. Likewise, in some embodiments, links 2676C can be unidirectional and in other embodiments links 2676C can be bidirectional.

From the foregoing, it should be understood that C/A connections 2680 and/or DQ connections 2670 comprise a memory interface configured to interface with a memory controller. Integrated circuit device 2610 is coupled to this interface. Integrated circuit device 2610 includes a processor 2612, an interface configured to connect to a first rank of dynamic memory integrated circuit devices 2640-2648, and an interface configured to connect to a second rank of dynamic memory integrated circuit device 2650-2658. Memory module 2602 includes a first rank of dynamic memory integrated circuit devices 2640-2648. Memory module 2602 can be configured by IC 2610, and the way it controls DQ buffers 2660-2668, to make this first rank of dynamic memory integrated circuit devices 2640-2648 either accessible or inaccessible to the memory controller. Memory module 2602 also includes a second rank of dynamic memory integrated circuit devices 2640-2648. Memory module 2602 can be configured by IC 2610, and the way it controls DQ buffers 2660-2668, to make this second rank of dynamic memory integrated circuit devices 2650-2658 either accessible or inaccessible to the memory controller. DQ buffers 2660-2668 are coupled to both the first rank of dynamic memory integrated circuit devices 2640-2648 and the second rank of dynamic memory integrated circuit devices 2650-2658. DQ buffers 2660-2668 are coupled to IC 2610 by links 2676C. These links 2676C may comprise at least one serial read link and at least one serial write link. In an embodiment, links 2676C include two serial read links and two serial write links for each DQ buffer 2660-2668. The links 2676C should be configured to transfer data to and from each DQ buffer 2660-2668 at an information rate that is at least the information rate each DQ buffer 2660-2668 is transferring data to the first rank of dynamic memory integrated circuit devices 2640-2648 and the second rank of dynamic memory integrated circuit devices 2650-2658. In this manner, all of the information transferred to and from the first rank of dynamic memory integrated circuit devices 2640-2648 and the second rank of dynamic memory integrated circuit devices 2650-2658 may be transferred to IC 2610. This provides IC 2610 the ability to "snoop" all of the data being sent to and from the first rank of dynamic memory integrated circuit devices 2640-2648 and the second rank of dynamic memory integrated circuit devices 2650-2658.

Memory module 2602 may respond to transactions on C/A connections 2680 that are directed to a memory aperture associated with IC 2610 by communicating data from IC 2610 to DQ connections 2670. Integrated circuit device 2610 may also include a local memory interface that is configured to connect to a local memory 2614. Memory module 2602 may include a local memory 2614 device that is coupled to this local memory interface.

In an embodiment, it should be understood that memory module 2602 includes a memory interface (e.g., C/A connections 2680) configured to interface to a memory controller. Memory module 2602 includes an integrated circuit device (e.g., IC 2610) that is coupled to the memory interface. The integrated circuit device includes a processor (e.g., processor 2612), a first command/address interface coupled to the processor and configured to connect to a first plurality of dynamic memory integrated circuits (e.g., the interface coupled to links 2681), and a second command/address interface coupled to the processor and configured to connect to a first plurality of dynamic memory integrated circuits (e.g., the interface coupled to links 2682).

Memory module 2602 also includes the first plurality of dynamic memory integrated circuits (e.g., memories 2650-2658), the second plurality of dynamic memory integrated circuits (e.g., memories 2640-2648), and at least one data buffer integrated circuit (e.g., one or more of DQ buffers 2660-2668). The first plurality of dynamic memory integrated circuits are coupled to the first command/address interface (e.g., by links 2681). The second plurality of dynamic memory integrated circuits are coupled to the second command/address interface (e.g., by links 2682). The at least one data buffer integrated circuit is coupled to the first plurality of dynamic memory integrated circuits (e.g., by links 2674C) and the second plurality of dynamic memory integrated circuits (e.g., by links 2675). The at least one data buffer integrated circuit is coupled to the memory interface (e.g., DQ connections 2670). The at least one data buffer integrated circuit are each coupled to the integrated circuit device by at least a read serial link and a write serial link (e.g., links 2676C).

The at least one data buffer may communicate data from the integrated circuit device in response to a transaction on the memory interface that is directed to a memory aperture associated with the integrated circuit device (for example, as described previously). The at least one data buffer may transfer data to and from memories 2650-2658 and 2640-2648 at a first information rate (e.g., the DDR3 byte rate) and the links 2676C may be configured to transfer data to and from the integrated circuit device at a second information rate that is at least the first information rate (e.g., the DDR3 byte rate or higher—or equivalently, a bit rate of 16× the DDR3 byte rate, or higher). In various embodiments, serial links 2676C may operate at other multipliers (e.g., 4× or 16×) and at, or more than, the data rates of other memory technologies mentioned herein (e.g., DDR4, DDR5, etc.) The links 2676C may be serial links, or may have a width greater than one bit, so long as the second information rate of the links 2676C is at least the first information rate. The integrated circuit device may include a local memory interface that is coupled to the processor. This local memory interface may be coupled to at least one integrated circuit memory device.

In another embodiment, an integrated circuit device (e.g., IC 2610) receives, from a memory interface (e.g., C/A connections 2680), a first memory command directed to a first rank of dynamic memory integrated circuit devices disposed on the memory module (such as a read command directed to an address stored in memories 2640-2648). The integrated circuit device can include a processor (e.g., processor 2612). For example, IC 2610 may receive, via C/A connections 2680, a memory read command from a memory controller. This memory read command may select memories 2640-2648. IC 2610 may relay this command to memories 2640-2648 thereby initiating a read burst from memories 2640-2648. The integrated circuit device may receive, from the memory interface, a second memory command directed to a second rank of dynamic memory integrated circuit devices disposed on the memory module (such as a read command directed to an address stored in memories 2650-2658). For example, IC 2610 may receive, via C/A connections 2680, a memory read command from a memory controller. This memory read command may select memories 2650-2658. IC 2610 may relay this command to memories 2650-2658 thereby initiating a read burst from memories 2650-2658.

In response to the first memory command, data from the first rank of dynamic memory integrated circuit devices that is associated with the first memory command is stored in at least one data buffer integrated circuit. For example, in response to a read command directed to an address stored in memories 2640-2648, DQ buffers 2660-2668 may latch (store) the read data output by memories 2640-2648 as a response to the read command (as relayed by IC 2610).

Under the control of the integrated circuit device, the data associated with the first memory command is communicated from the at least one data buffer integrated circuit to the memory interface such that the first rank of dynamic memory integrated circuit devices are accessible to the memory controller. For example, IC 2610 may use one or more buffer control signals 2677C to cause DQ buffers 2660-2668 to output the read data they latched onto DQ connections 2670. The memory controller can receive this read data from DQ buffers 2660-2668 thereby completing a read access, of memories 2640-2648, by the memory controller.

The integrated circuit device may receive, from the memory interface, a second memory command directed to the first rank of dynamic memory integrated circuit devices (e.g., a second read command directed to an address stored in memories 2640-2648). This memory read command may or may not select memories 2640-2648. IC 2610 may optionally relay this command to memories 2640-2648 thereby initiating a read burst from memories 2640-2648. IC 2610 may, for example, intercept this read command and not relay it to memories 2640-2648 in order to reduce power consumption, or use the memory cycles associated with this command for its own purposes.

In response to the second memory command, data from the integrated circuit that is associated with the second memory command is stored in at least one data buffer integrated circuit. For example, in response to a read command directed to an aperture associated with IC 2610, IC 2610 may send, via links 2676C, data to DQ buffers 2660-2668 to be latched (stored).

Under the control of the integrated circuit device, the data associated with the second memory command is communicated from the at least one data buffer integrated circuit to the memory interface such that data processed by the processor is accessible to the memory controller. For example, IC 2610 may use one or more buffer control signals 2677C to cause DQ buffers 2660-2668 to output the data received from IC 2610 via links 2676C. This data may have been processed by processor 2612. The memory controller can receive this read data from DQ buffers 2660-2668 thereby completing a read access, by the memory controller, of the aperture associated with IC 2610 (and thereby also associated with processor 2612).

The integrated circuit device may also control the at least one data buffer integrated circuit to communicate the data associated with the first memory command to the integrated circuit. For example, IC 2610 may use one or more buffer control signals 2677C to cause DQ buffers 2660-2668 to output the read associated with the first memory command onto one or more links 2676C. In this manner, IC 2610 can "snoop" the all or part of the data associated with memory transactions that read memories 2640-2648.

The integrated circuit device may also be coupled to a memory that its processor uses as a local memory or cache. This cache may be used to cache data stored in the first rank of dynamic memory integrated circuit devices. The data supplied to the at least one data buffer integrated circuit may have been stored in this local memory (or cache) prior to being sent by the integrated circuit device to the at least one data buffer integrated circuit. For example, IC 2610 may satisfy the read of the aperture associated with IC 2610 using data that was stored in local memory 2614 at a time prior to the read of the aperture by the memory controller. Similar to the access steps described above, a third memory command may cause data stored in a second rank of dynamic memory integrated circuit devices to be stored in the at least one data buffer integrated circuit. For example, data stored in memories 2650-2658 may be read by the memory controller using similar steps to previously described for accessing (and snooping) memories 2640-2648.

A write to the first rank of dynamic memory integrated circuit devices is performed in a similar manner to a read, except with the data flows reversed. In other words, to perform a write to memories 2640-2648: (1) a write command is received by IC 2610 via C/A connections 2680 and relayed to memories 2640-2648; (2) the write data is latched from DQ connections 2670 into DQ buffers 2660-2668; and, (3) the write data is communicated to memories 2640-2648 via links 2675 at the appropriate time. Likewise, a write to the aperture associated with the integrated circuit device is performed in a similar manner to a read with the data flows reversed. In other words, to perform a write to the aperture associated with IC 2610: (1) a write command is received by IC 2610 via C/A connections 2680 and may optionally be relayed to memories 2640-2648; (2) the write data is latched from DQ connections 2670 into DQ buffers 2660-2668; and, (3) the write data is communicated to IC 2610 via links 2677C. This write operation gives processor 2612 and any other part of IC 2610 access to data being written to the aperture associated with IC 2610. IC 2610 can also snoop data being written to memories 2640-2648.

Memory module 2602 may receive a memory command directed to memories 2640-2648. This memory command may be received by IC 2610. In response to this memory command, memories 2640-2648 may output data associated with the command and DQ buffers 2660-2668 may store that data. IC 2610 may then control DQ buffers 2660-2668 to communicate this data to DQ connections 2670. This allows memories 2640-2648 to be accessible to a memory controller coupled to memory module 2602. IC 2610 may also control DQ buffers 2660-2668 to communicate this data to IC 2610 via links 2676C. This allows IC 2610 to snoop data read from memories 2640-2648.

Memory module 2602 may receive a second memory command directed to memories 2640-2648. This second memory command may also be received by IC 2610. This second memory command may be directed to an aperture associated with IC 2610. In response to this memory command, integrated circuit 2610 may output second data associated with the second command (e.g., via links 2676C) and DQ buffers 2660-2668 may store that second data. IC 2610 may then control DQ buffers 2660-2668 to communicate this second data to DQ connections 2670. This allows data processed by processor 2612 to be accessible to a memory controller coupled to memory module 2602.

IC 2610 may send a third memory command to memories 2650-2658. This third memory command may instruct memories 2650-2658 to retrieve third data from memories 2650-2658. In response to this memory command, memories 2650-2658 may output third data associated with the third memory command and DQ buffers 2660-2668 may store that third data. IC 2610 may then control DQ buffers 2660-2668 to communicate this third data to DQ connections 2670. This allows memories 2650-2658 to be accessible to a memory controller coupled to memory module 2602.

IC 2610 may originate and send a fourth memory command to memories 2650-2658. This fourth memory command may instruct memories 2650-2658 to retrieve fourth data from memories 2650-2658. In response to this fourth memory command, memories 2650-2658 may output fourth data associated with the fourth memory command and DQ buffers 2660-2668 may store that fourth data. IC 2610 may then control DQ buffers 2660-2668 to communicate this fourth data to IC 2610 via links 2676C. This allows memories 2650-2658 to be accessible to processor 2612.

Memory module 2602 may receive a memory command directed to memories 2640-2648. This memory command may be received by IC 2610. In response to this memory command, data associated with the command may arrive at DQ connections 2670 and DQ buffers 2660-2668 may store that data. IC 2610 may then control DQ buffers 2660-2668 to communicate this data to memories 2640-2648. This allows memories 2640-2648 to be accessible to a memory controller coupled to memory module 2602. IC 2610 may also control DQ buffers 2660-2668 to communicate this data to IC 2610 via links 2676C. This allows IC 2610 to snoop data written to memories 2640-2648.

Memory module 2602 may receive a second memory command directed to memories 2640-2648. This second memory command may also be received by IC 2610. This second memory command may be directed to an aperture associated with IC 2610. To complete this memory command, second data associated with the second memory command may arrive at DQ connections 2670 and DQ buffers 2660-2668 may store that second data. IC 2610 may then control DQ buffers 2660-2668 to communicate this second data to IC 2610 via links 2676C. This allows processor 2612 to access the second data sent by the memory controller coupled to memory module 2602.

IC 2610 may originate and send a third memory command to memories 2650-2658. This third memory command may instruct memories 2650-2658 to store third data in memories 2650-2658. In correspondence to this third memory command, IC 2610 may output (e.g., via links 2676C) third data associated with the third memory command and DQ buffers 2660-2668 may store that third data. IC 2610 may then control DQ buffers 2660-2668 to communicate this third data to memories 2650-2658. This allows memories 2650-2658 to be write accessible to processor 2612.

IC 2610 may send a fourth memory command to memories 2650-2658. This fourth memory command may instruct memories 2650-2658 to store fourth data in memories 2650-2658. To complete this fourth memory command, fourth data associated with the fourth command may arrive at DQ connections 2670 and DQ buffers 2660-2668 may store that fourth data. IC 2610 may then control DQ buffers 2660-2668 to communicate this fourth data to IC memories 2650-2658. This allows memories 2650-2658 to be write accessible to the memory controller coupled to memory module 2602.

Figure 1:
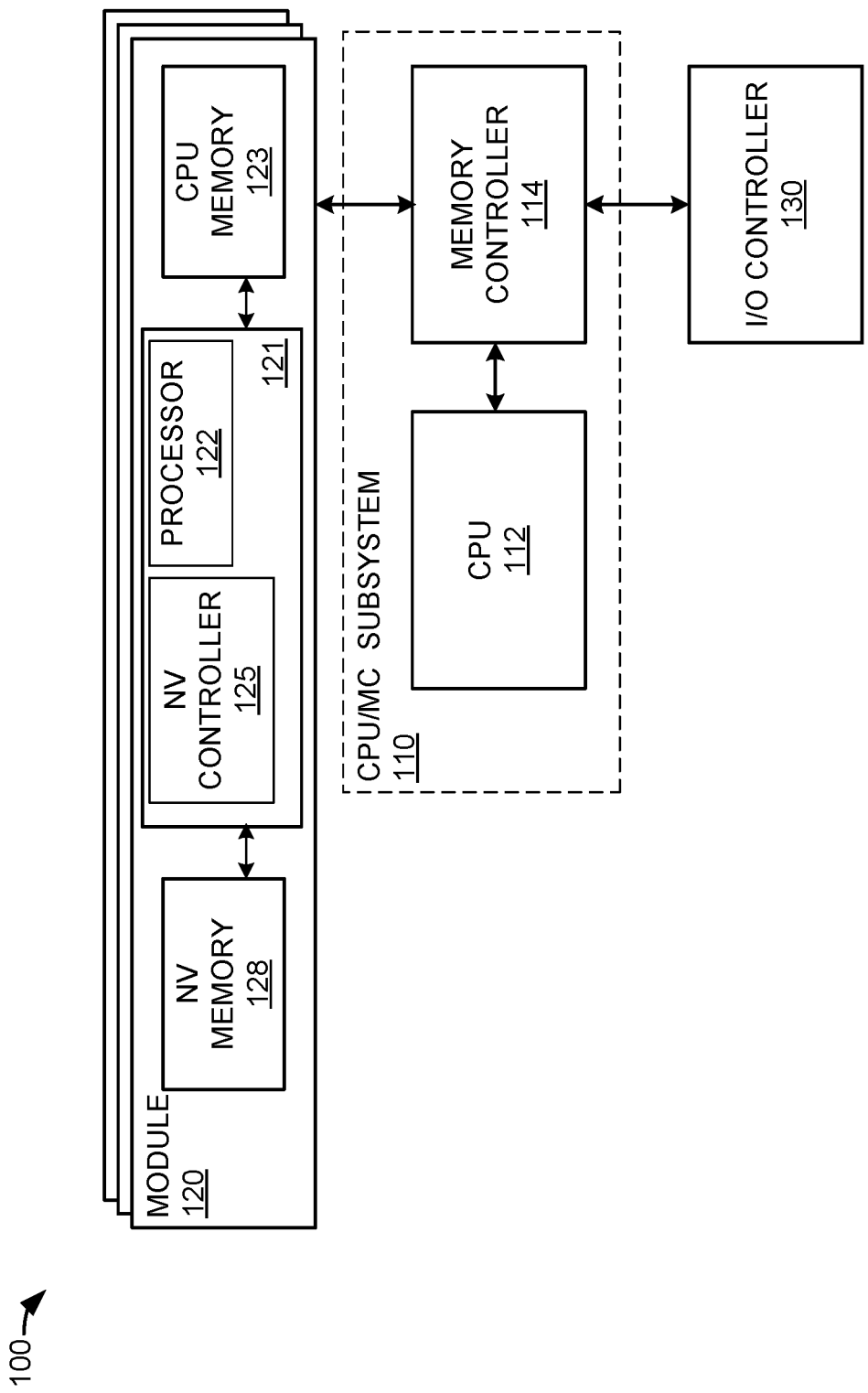
FIG. 1 is an illustration of a hybrid flash/DRAM memory module.

FIG. 1 is an illustration of a hybrid flash/DRAM memory module. In FIG. 1, computer system 100 comprises CPU/memory controller subsystem 110, I/O controller 130, and memory modules 120. CPU/memory controller subsystem 110 includes a CPU 112 coupled to a memory controller 114. One or more memory modules 120 are coupled to memory controller 114 in subsystem 110. Each memory module 120 includes integrated circuit (IC) device 121, CPU memory 123 (a.k.a., main memory), and nonvolatile memory 128. IC 121 includes a nonvolatile memory controller 125 and processor 122. Processor 122 may be part of a buffer device. Processor 122 may be or comprise a microprocessor, finite state machine, or other logic circuitry that is part of a buffer device. Memory 123 typically contains instructions and/or data used by the CPU 112 and/or IC 121. It should be understood that integrated circuit device 121 may correspond to IC 2610 in memory modules 2600, 2601, and/or 2602 and that module 120 may be an embodiment of memory modules 2600, 2601, and/or 2602.

It should be understood that CPU 112 may include multiple processor cores. CPU 112 may include stacked die devices having one or more processors and/or memory stacked using, for example, though-silicon vias. CPU 112 may include and/or be a specialized processor such as, for example, a digital signal processor, graphics processing unit (GPU), an array processor, storage management processor, data analytic processor (e.g., Hadoop distributed file system processor or a MapReduce processor), pattern recognition processor, and/or image manipulation processor (i.e., image processor). CPU 112 can divide up and coordinate compute processes and tasks among modules 120.

IC 121 may also be referred to as a "compute engine," "computing engine," "graphics processor," "rendering engine," "processing unit," "accelerator", "offload engine," and/or GPU. IC 121 may include and/or be a heterogeneous processing unit that includes the functions of one or more of a CPU, GPU, video processor, etc. IC 121 may include, or be, a serial-ATA (SATA), serial attached SCSI (SAS), eSATA, PATA, IEEE 1394, USB (all revisions), SCSI Ultra, FiberChannel, Infiniband, Thunderbolt, or other industry standard I/O interfaces (such as PCI-Express—PCIe). IC 121 may include, or be, a network processor unit (NPU) such as a TCP offload engine (TOE), a protocol translator (e.g., TCP over SATA, TCP over PCI-Express, accelerated SCSI interconnect, etc.), and/or a protocol packet translator. IC 121 may include, or be, a fixed function graphics processing unit, an encryption/decryption accelerator/offload engine (e.g., for implementing/accelerating SSL, AEC, DEC, etc.), a compressor/decompressor, a regular expression accelerator engine, a digital signal processor (DSP), a signal path processor, a Fourier transform processor, an inverse Fourier transform processor, and/or a media format encoder/decoder (e.g., JPEG, DVX, AVI, MP2, MP3, MP4, Blu-ray, HD-DVD, DVD, etc.). It should also be understood that module 120 may be coupled to a local SSD/HDD and/or enterprise storage type systems such as external disks, external disk arrays, JBODs, RAID arrays, tape drives, optical drives, and the like.

Memory 123 typically includes multiple memory devices coupled together to form a block of storage space. Memory 123 may be, or comprise, but is not limited to, SRAM, DDR3, DDR4, DDR5, XDR, XDR2, GDDR3, GDDR4, GDDR5, LPDDR, and/or LPDDR2 and successor memory standards and technologies. Memory 123 may be or comprise a stack of devices such as a through-silicon-via (TSV) stack and/or a hybrid memory cube (HMC). Further information about HMC is available from the Hybrid Memory Cube Consortium (http://hybridmemorycube.org/).

Each IC 121 is capable of performing various memory access and/or data processing functions. For the embodiment shown in FIG. 1, memory controller 114 is also coupled to an I/O controller 130 which controls the flow of data into and out of the system. An optional video input port (not shown in FIG. 1) can provide data to memory controller 114. A display interface (not shown in FIG. 1) can provide data output to one or more devices (such as display devices or storage devices). For systems which support video input or capture capability, a video input port on the memory controller 114 is one way to handle the delivery of video source data. Another means of delivery of video input data to the system would include delivering the data from a peripheral module through the I/O controller 130 to memory controller 114.

In the example of FIG. 1, CPU/memory controller subsystem 110 is coupled to multiple distinct memory modules 120. Each memory module 120 includes IC 121, and nonvolatile memory 128. IC 121 may be or comprise a microprocessor, finite state machine, or other logic circuitry that is part of a buffer device. Each IC 121 is capable of performing various data processing functions. Thus, the IC 121 on different (or the same) memory modules are capable of performing different processing functions simultaneously (i.e., parallel processing). The IC 121 on different (or the same) memory modules are capable of performing vector parallel processing where functions are vectorized and divided among the IC's 121. The IC 121 on different (or the same) memory modules are capable of performing cluster parallel processing where the IC's 121 cooperate to work on the same problem simultaneously (or concurrently). Further, each IC 121 is capable of communicating with other IC 121 on other memory modules 120.

Each IC 121 is capable of communicating with other ICs 121 on other memory modules 120 with the aid of CPU 112 and/or memory controller 114. Modules 120 and/or IC 121 may be heterogeneous. In other words, modules 120 and/or ICs 121 may not all be identical. ICs 121 may include multiple processor cores that are not all identical. For example, ICs 121 may comprise a mix of CPU type and GPU type processing cores. Modules 120 and/or ICs 121 may perform different functions at the same time. Modules 120 and/or ICs 121 may be produced by different vendors. Modules 120 and/or ICs 121 produced by different vendors may be added, subtracted, and used interchangeably in a plug-and-play manner. Modules 120 and/or ICs 121 may function in parallel running independent (and non-independent) copies of software, processes, applications, and operating systems similar to how virtual machines operate.

CPU 112 can control memory controller 114 to distribute particular processing tasks (such as graphical processing tasks, Hadoop, and/or MapReduce tasks) to ICs 121, and can perform certain processing tasks itself. These tasks may include data to be processed and/or instructions to be executed. These tasks may include executing all or parts of applications, drivers, software layers, runtime functions, and/or operating system code. Although three memory modules 120 are shown in FIG. 1, an alternate system may contain any number of memory modules coupled to one or more memory controllers 114. The ability to add and remove memory modules 120 can provide an upgradeable and scalable memory and computing architecture. In addition, it should be understood that the modules in system 100 may be heterogeneous. In other words, a portion of a set of memory modules 120 in a system 100 may be hybrid flash/DRAM type modules, and others may be other types of modules (e.g., entirely DRAM, entirely storage, and/or entirely nonvolatile memory). System 100 can support mixed types of modules. It should also be understood that the hybrid flash/DRAM type modules 120 are an example that illustrates that there can be nonvolatile, high-capacity (i.e., higher than DRAM modules) storage accessed via a memory channel. A particular module 120 can be, for example, an all-flash module, or even newer storage class memories that may or may not include DRAM on the module.

CPU 112 may communicate with IC 121 by reading from, and writing to, an address aperture associated with module 120. CPU 112 can be configured to use any cache policy supported by processor CPU 112 to read from, and write to, this address aperture (or portions thereof). However, it should be understood that, in an embodiment, the most useful cache policies may be limited to configuring the address aperture (or portions thereof) to be treated by CPU 112 as uncacheable memory (UC), write combining memory (WC), or write back (WB). In an embodiment, these cache policies may be combined with the use of certain instructions (e.g., fence instructions, streaming load instructions, and/or streaming write instructions) to achieve an optimal (e.g., highest) communication bandwidth between CPU 112 and IC 121. In addition, when the address aperture (or portions thereof) are configured to be treated as WC or WB, at least a minimum burst size may be used to achieve an optimal (e.g., highest) communication bandwidth between CPU 112 and IC 121. In other words, small burst sizes (e.g., less than a certain, implementation dependent, number of column addresses per burst) may result in less than optimal communication bandwidth between CPU 112 and IC 121. Larger sizes (e.g., greater than a certain, implementation dependent, number of column addresses per burst) may approach (or approximate) an optimal (e.g., highest) communication bandwidth between CPU 112 and IC 121. It should be understood that computer system 100 may utilize a unified memory architecture or a non-unified memory architecture. Computer system 100 is not limited to heterogeneous memory. Further, it should also be understood that computer system 100 (and CPU 112, in particular) may utilize a cache or caching policies that are coherent or not coherent.

It may also be useful to configure the address aperture (or portions thereof) to be UC for testing, ease of implementation, and/or when the bandwidth between CPU 112 and IC 121 is not a relatively high priority. Configuring the address aperture (or portions thereof) to be WB may be most useful for testing purposes. Configuring the address aperture (or portions thereof) to be WC may, in some embodiments, result in the highest bandwidth between CPU 112 and IC 121.

In an embodiment, CPU 112 communicates with IC 121 by reading from, and writing to, an address aperture associated with module 120. This address aperture may be further divided into address ranges (a.k.a. ports) that are configured for communication of commands, status, and data. The ports of the address aperture may be configured and sized as blocks of addresses (e.g., column addresses).

In an embodiment, the operating system running on computer 100 may produce I/O commands that are directed to block I/O and/or storage type devices. One or more of these block I/O or storage type devices may correspond to, or have, stored data that resides on a memory module 120. In response to a block I/O or storage command for data stored on memory module 120, CPU 112 may direct a memory interface command to memory module 120 by reading from, and/or writing to, an address aperture associated with module 120.

To produce I/O commands that are directed to block I/O or storage type devices, the operating system kernel running on computer 100 may direct block device commands to a generic block layer. In response to these block device commands, the operating system may translate the block device commands which were directed to the generic block layer into the memory interface commands that are sent to memory module 120.

Processor 122 may execute all or part of a block storage I/O driver that services the block I/O storage type device commands for data stored in nonvolatile memory 128. Nonvolatile memory controller 125 may be or include a solid-state disk controller that provides a block I/O storage interface to processor 122. This block I/O storage interface can be used for the communication of data to and from nonvolatile memory 128. This block I/O storage interface may use, for example, SCSI or ATA commands.

In an embodiment, module 120 may be configured to service RPC requests for block I/O storage type device commands using nonvolatile memory 128. These RPC requests may be received by a module 120 via the DRAM memory channel that operatively couples memory controller 114 to the module 120. The RPC requests that are serviced by a module 120 may originate from a processor (not shown in FIG. 1) that is not directly connected to the module 120 (e.g., a remote processor on a network).

Procedure calls and procedure data received by a module 120 via the DRAM memory channel may be executed on the module 120 (e.g., by processor 122 and/or nonvolatile memory controller 125). These procedure calls and the procedure data may be communicated to a module 120 via memory write transactions addressed to a memory space (e.g., aperture) of the module 120. These procedure calls may include RPC requests. Procedure calls and procedure data executed by module 120 may implement one or more virtual file system procedure calls. Nonvolatile memory 128 may be accessed using NFS requests that are communicated to module 120 via memory write transactions addressed to a memory space of the module 120. Nonvolatile memory 128 may be accessed using HDFS requests that are communicated to module 120 via memory write transactions addressed to a memory space of the module 120.

Procedure calls received by a module 120 via the DRAM memory channel may be executed on the module 120. These procedure calls may include block I/O storage type device commands that are serviced using nonvolatile memory 128. These procedure calls may include map calls that specify an application-specific map operation to be performed by the module on a respective input data block to be stored using nonvolatile memory 128. The map operation may also produce intermediate data values to be stored using nonvolatile memory 128.

Figure 2:
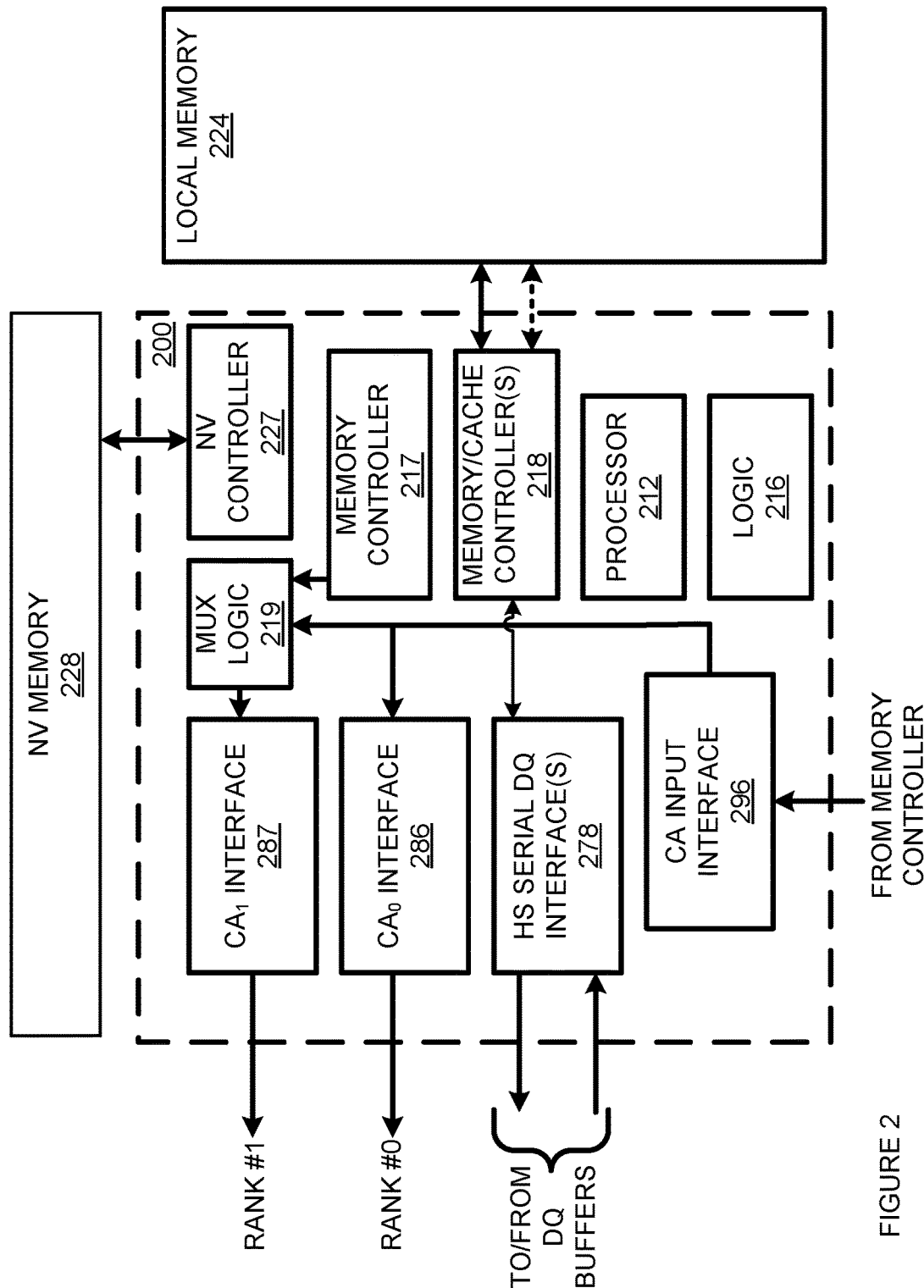
FIG. 2 is a block diagram illustrating a hybrid flash/DRAM compute subsystem.

FIG. 2 is a block diagram illustrating a hybrid flash/ DRAM compute subsystem. In FIG. 2, subsystem 201 comprises subsystem 200, local memory 224, and nonvolatile memory 228. Subsystem 200 comprises processor 212, logic 216, memory controller 217, CA input interface 296, multiplexor (MUX) logic 219, CA0 interface 286, CA1 interface 287, HS serial DQ interface(s) 278, and nonvolatile memory controller 227. Subsystem 200 also includes memory/cache controller(s) 218. Memory/cache controller 218 is operatively coupled to local memory 224. Local memory 224 may include a cache memory partition and a processor memory partition. Local memory 224 may be operatively coupled to subsystem 200 by one or more memory channels. It should be understood that subsystem 201 may be included on a memory module 120. Thus, it can be seen that subsystem 200 may be used as IC 121 in a memory module 120 and that subsystem 201 may be disposed on memory modules 120. It can be seen that subsystem 200 may be used as IC 2610 in memory modules 2600, 2601, and/or 2602 and that subsystem 201 may be disposed on memory modules 2600, 2601, and/or 2602.

In an embodiment, a memory module having subsystem 201 (e.g., memory modules 120) can have a memory interface configured to connect with a memory controller. Subsystem 200 may be an integrated circuit device that is coupled to the memory interface. Subsystem 200 includes processor 212, CA1 interface 287, nonvolatile memory controller 227, and an interface to nonvolatile memory 228. CA1 interface 287 is configured to connect to a first type of dynamic memory integrated circuit devices. Nonvolatile memory controller 227 is coupled to processor 212. The interface to nonvolatile memory 228 is configured to couple nonvolatile memory controller 227 to at least one nonvolatile memory integrated circuit device. A plurality of the first type of dynamic memory integrated circuit devices is coupled to CA1 interface 287. At least one nonvolatile memory integrated circuit device is coupled to subsystem 200 via the interface to nonvolatile memory 228.

Subsystem 201 may also include a local memory 224. This local memory 224 may comprise at least one of a second type of dynamic memory integrated circuit device. Local memory 224 may connect to subsystem 200 via an interface. This interface may couple local memory 224 to processor 212 via memory/cache controller 218. Local memory 224 may be used to cache data stored in the dynamic memory integrated circuit devices coupled to CA1 interface 287. Subsystem 201 may include an SSD controller coupled to processor 212 and nonvolatile memory controller 227. Subsystem 201 may include a SATA controller coupled to processor 212 and nonvolatile memory controller 227. Nonvolatile memory 228 may store an operating system that processor 212 can boot up and execute. This operating system may be a different operating system than, for example, CPU 212 boots and runs. The memory module may receive instructions via the memory interface that cause processor 212 to perform operations on data. Subsystem 200 may return the results of these operations via the memory interface.

In an embodiment, a memory module having subsystem 201 (e.g., memory modules 120) can have a memory interface to connect to a memory channel. This memory module may include a plurality of dynamic memory integrated circuits. The memory module may have a nonvolatile memory 228 comprising at least one nonvolatile memory integrated circuit device. The memory module may include subsystem 200. Subsystem 200 includes processor 212, CA1 interface 287, NV controller 227, and CA input interface 296, and High-speed (HS) serial DQ interface 278. CA1 interface 287 is coupled to the plurality of dynamic memory integrated circuits. NV controller 227 is coupled to nonvolatile memory 228 via an interface.

In an embodiment, subsystem 200 receives a memory command from a memory controller coupled to CA input interface 296. In response to this memory command, subsystem 200 stores data in the plurality of dynamic memory integrated circuits coupled to CA1 interface 287 and/or a plurality of dynamic memory integrated circuits coupled to CA0 interface 286. In response to a command from processor 212, subsystem 200 stores data in nonvolatile memory 228.

Figure 3:
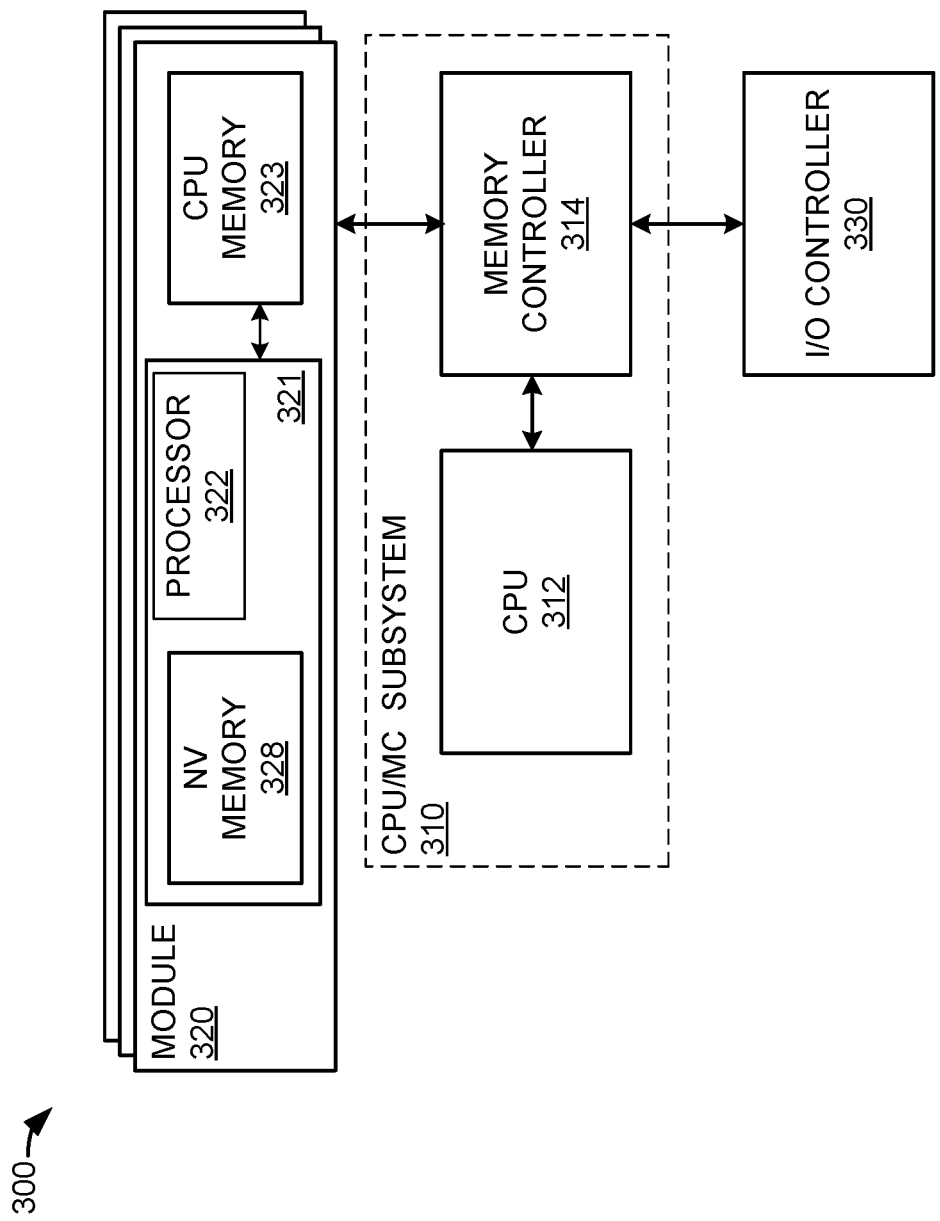
FIG. 3 is an illustration of a hybrid flash/DRAM memory module.

FIG. 3 is an illustration of a hybrid flash/DRAM memory module. In FIG. 3, computer system 300 comprises CPU/ memory controller subsystem 310, I/O controller 330, and memory modules 320. CPU/memory controller subsystem 310 includes CPU 312 coupled to memory controller 314. One or more memory modules 320 are coupled to memory controller 314 in subsystem 310. Each memory module 320 includes integrated circuit device 321 and CPU memory 323. Integrated circuit device 321 includes nonvolatile memory 328 and processor 322. CPU memory 323 typically contains instructions and/or data used by the CPU 312. CPU memory 323 can be dynamic memory integrated circuits. Integrated circuit device 321 can include other functionality. Accordingly, it should be understood that integrated circuit device 321 may correspond to IC 121 and/or nonvolatile memory 128 on memory module 120 or subsystem 200, and that module 320 may be an embodiment of memory module 120. It should be understood that integrated circuit device 321 may correspond to IC 2610 in memory modules 2600, 2601, and/or 2602 and that module 320 may be an embodiment of memory modules 2600, 2601, and/or 2602.

Since nonvolatile memory 328 is included in integrated circuit device 321, nonvolatile memory 328 may be accessed directly by a processor 322. Integrated circuit device 321 may include an SATA interface. Processor 322 and/or integrated circuit device 321 and an SSD on integrated circuit device 321 may communicate via an SATA interface. Module 320 may include a SATA connector for communicating with an SSD/HDD external to the module 320.

Figure 4:
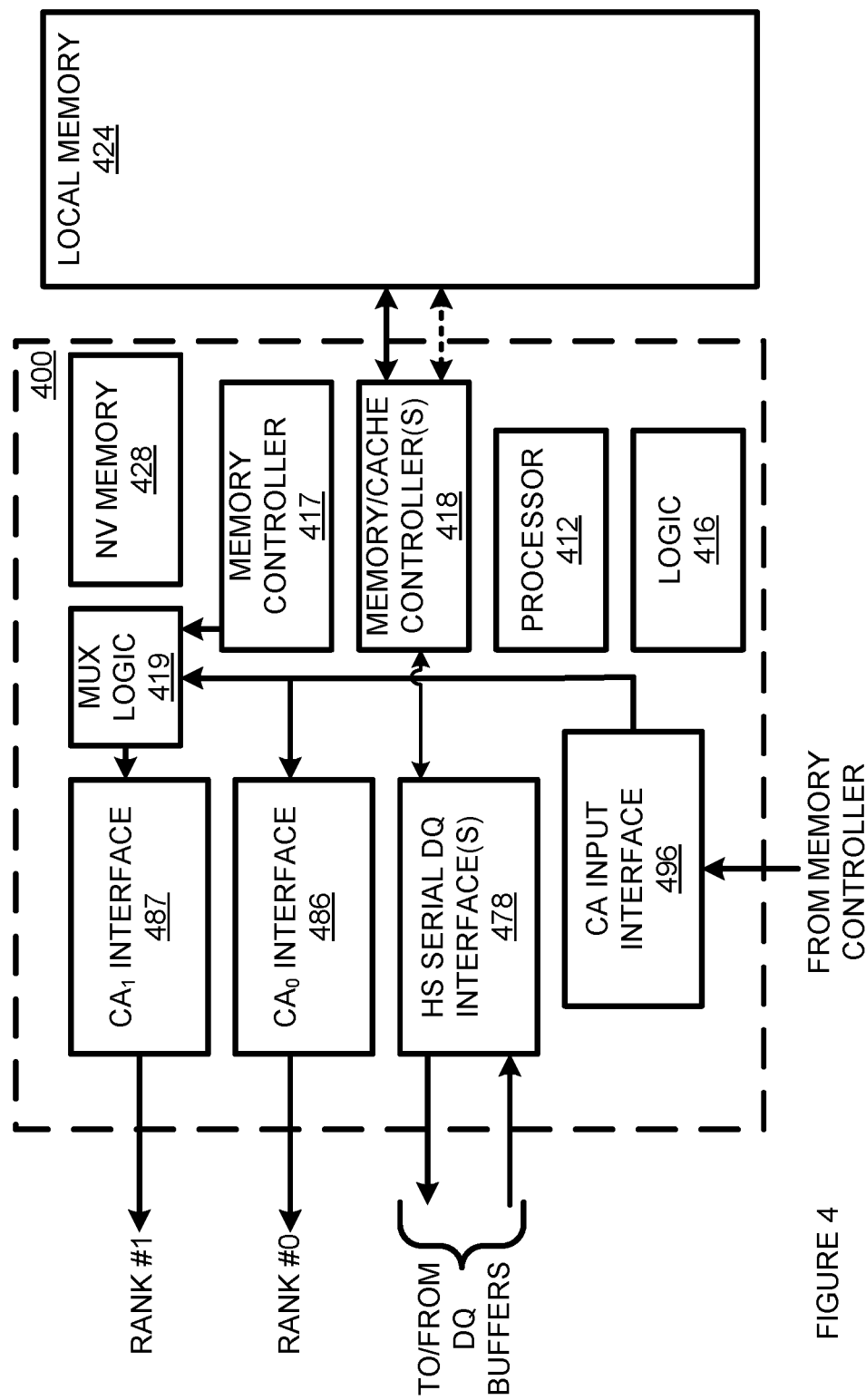
FIG. 4 is a block diagram illustrating a hybrid flash/DRAM compute subsystem.

FIG. 4 is a block diagram illustrating a hybrid flash/ DRAM compute subsystem. FIG. 4 is a block diagram illustrating a hybrid flash/DRAM memory module compute subsystem. In FIG. 4, subsystem 401 comprises subsystem 400 and local memory 424. Subsystem 400 comprises processor 412, logic 416, memory controller 417, CA input interface 496, multiplexor (MUX) logic 419, CA0 interface 486, CA1 interface 487, high-speed (HS) serial DQ interface(s) 478, and nonvolatile memory 428. Subsystem 400 also includes memory/cache controller(s) 418. Memory/ cache controller 418 is operatively coupled to local memory 424. Local memory 424 may be operatively coupled to subsystem 400 by one or more memory channels. It should be understood that subsystem 401 may be included on a memory module 320. Thus, it can be seen that subsystem 400 may be used as IC 121 in memory module 120, or as IC 321 in memory module 320, and that subsystem 401 may be disposed on memory modules 120, and/or 320. It can be seen that subsystem 400 may be used as IC 2610 in memory modules 2600, 2601, and/or 2602 and that subsystem 401 may be disposed on memory modules 2600, 2601, and/or 2602.

In an embodiment, a memory module having subsystem 401 (e.g., memory modules 120 and/or 320) can have a memory interface configured to connect with a memory controller. Subsystem 400 may be an integrated circuit device that is coupled to the memory interface. Subsystem 400 includes a processor 412, CA1 interface 487, and nonvolatile memory 428. CA1 interface 487 is configured to connect to a first type of dynamic memory integrated circuit devices. Nonvolatile memory 428 is coupled to processor 412. A plurality of the first type of dynamic memory integrated circuit devices is coupled to CA1 interface 487.

Subsystem 401 may also include a local memory 424. This local memory 424 may comprise at least one of a second type of dynamic memory integrated circuit device. Local memory 424 may connect to subsystem 400 via an interface. This interface may couple local memory 424 to processor 412 via memory/cache controller 418. Local memory 424 may be used to cache data stored in the dynamic memory integrated circuit devices coupled to CA1 interface 487. Nonvolatile memory 428 may store an operating system that processor 412 can boot up and execute. The memory module may receive instructions via the memory interface that cause processor 412 to perform operations on data. Subsystem 400 may return the results of these operations via the memory interface.

In an embodiment, a memory module having subsystem 401 (e.g., memory modules 120, and/or 320) can have a memory interface to connect to a memory channel. This memory module may include a plurality of dynamic memory integrated circuits. The memory module may include subsystem 400. Subsystem 400 includes processor 412, CA1 interface 3187, NV controller 427, CA input interface 496, High-speed (HS) serial DQ interface 478, and nonvolatile memory 428. CA1 interface 487 is coupled to the plurality of dynamic memory integrated circuits.

In an embodiment, subsystem 400 receives a memory command from a memory controller coupled to CA input interface 496. In response to this memory command, subsystem 400 stores data in the plurality of dynamic memory integrated circuits coupled to CA1 interface 487 and/or a plurality of dynamic memory integrated circuits coupled to CA0 interface 486. In response to a command from processor 412, subsystem 400 stores data in nonvolatile memory 428.

Figure 5:
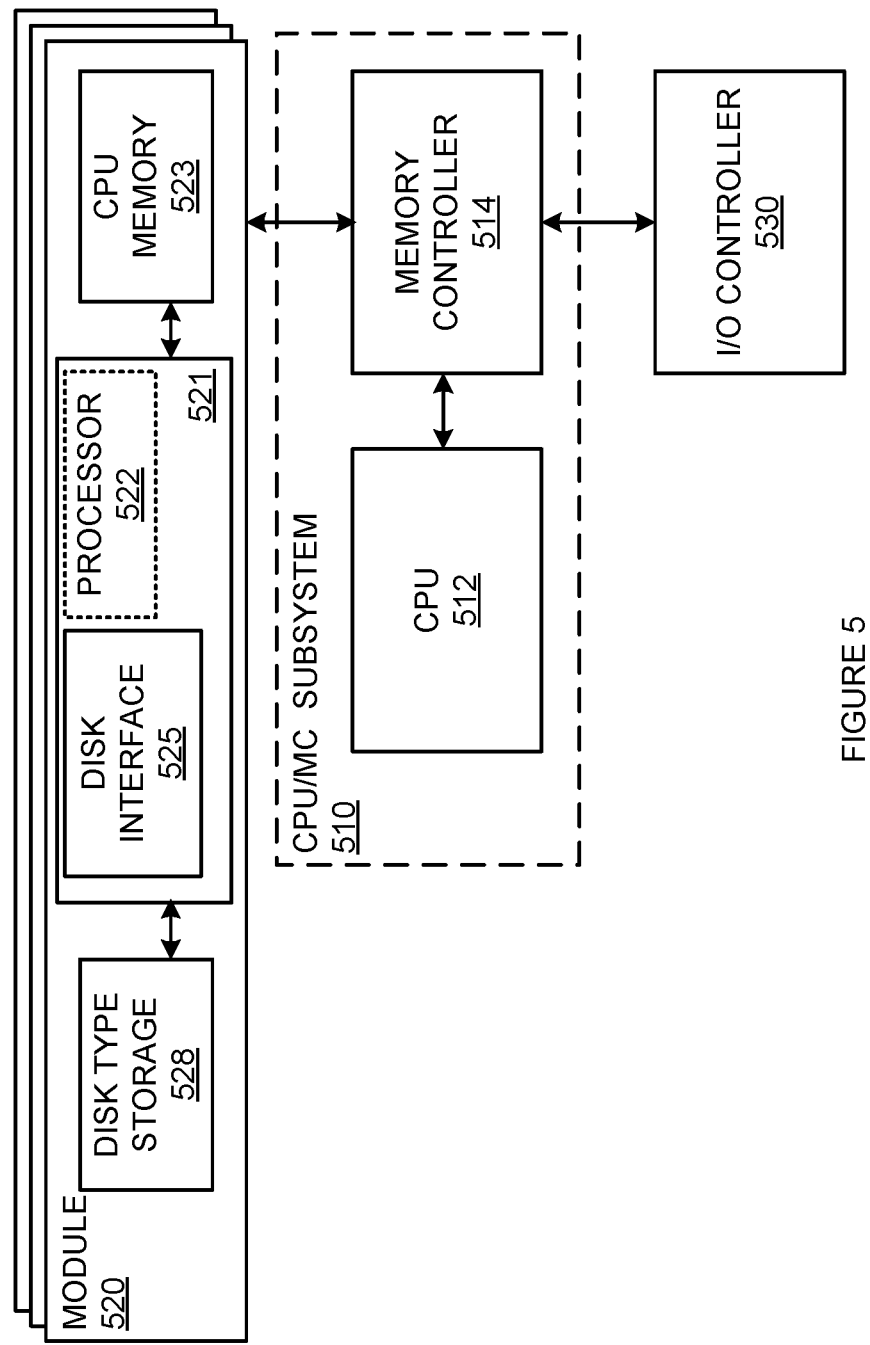
FIG. 5 is an illustration of a hybrid disk type nonvolatile storage and DRAM memory module.

FIG. 5 is an illustration of a hybrid disk type nonvolatile storage and DRAM memory module. FIG. 5 is an illustration of a hybrid disk type nonvolatile storage and DRAM memory module. In FIG. 5, computer system 500 comprises CPU/memory controller subsystem 510, I/O controller 530, and memory modules 520. CPU/memory controller subsystem 510 includes CPU 512 coupled to memory controller 514. One or more memory modules 520 are coupled to memory controller 514 in subsystem 510. Each memory module 520 includes integrated circuit device 521, CPU memory 523, and disk type storage 528. Integrated circuit device 521 includes a disk interface 525 and processor 522. CPU memory 523 typically contains instructions and/or data used by the CPU 512. Disk type storage 528 typically contains instructions and/or data used by CPU 512 and/or processor 522. CPU memory 523 can be dynamic memory integrated circuits. Integrated circuit device 521 can include other functionality. Accordingly, it should be understood that integrated circuit device 521 may correspond to IC 121 in memory module 120, IC 321 in memory module 320 or subsystems 200, and/or 300 and that module 520 may be an embodiment of memory modules 120 and/or 320. It should be understood that integrated circuit device 521 may correspond to IC 2610 in memory modules 2600, 2601, and/or 2602 and that module 520 may be an embodiment of memory modules 2600, 2601, and/or 2602.

The module 520 illustrated in FIG. 30 includes disk type storage 528. Disk type storage may be, or include, but is not limited to, a solid-state disk drive, flash memory controlled and organized as a disk type mass storage device (e.g., a USB memory stick), or a small form-factor magnetic disk drive (e.g., a 1.8" or smaller hard disk drive).

Disk interface 525 manages/controls disk type storage 528. Thus, module 520 can have a combination of DRAM and disk type storage 528. Disk interface 525 may include (or be) an SSD controller (with or without an additional processor). Disk interface 525 on module 520 may be accessed by CPU 512 via the memory channel which typically has higher bandwidth than an I/O bus.

Disk type storage 528 may be accessed directly by a processor 522. In other words, disk type storage 528 may be accessed by a processor 522 without passing the data/address through memory controller 514 or relying upon CPU 512. Disk interface 525 may be or include an SATA interface. Processor 522 and/or integrated circuit device 521 and disk type storage 528 may communicate via an SATA interface. Module 520 may include a SATA connector for communicating with an SSD/HDD external to the module 520.

Figure 6:
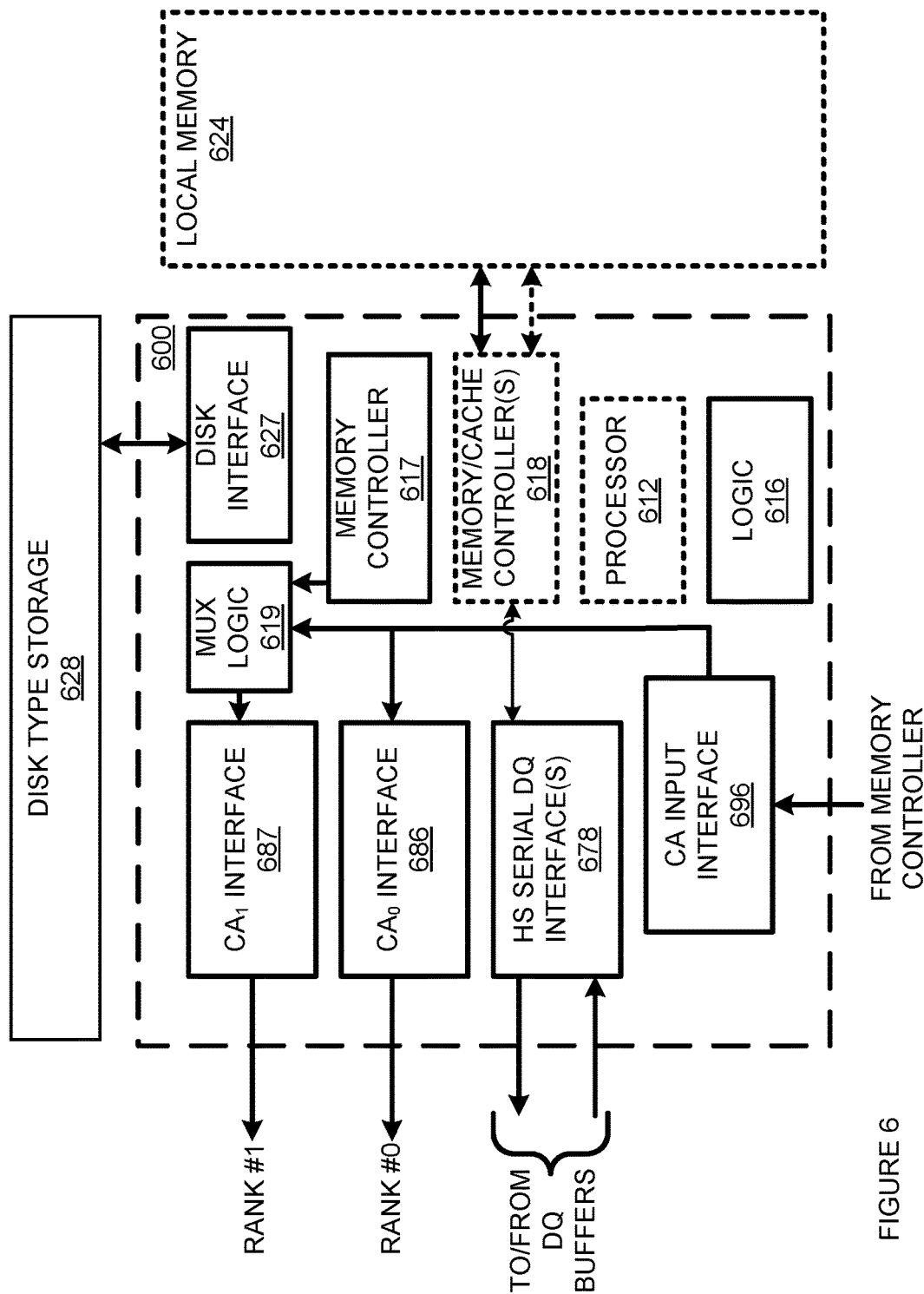
FIG. 6 is a block diagram illustrating a hybrid disk type nonvolatile storage and DRAM memory module compute subsystem.

FIG. 6 is a block diagram illustrating a hybrid disk type nonvolatile storage and DRAM memory module compute subsystem. In FIG. 6, subsystem 601 may comprise subsystem 600, optional local memory 624, and disk type storage 628. Subsystem 600 comprises logic 616, memory controller 617, CA input interface 696, multiplexor (MUX) logic 619, CA0 interface 686, CA1 interface 687, HS serial DQ interface(s) 678, and disk interface 627. Subsystem 600 may optionally include processor 612 and memory/cache controller(s) 618. If included, memory/cache controller 618 is operatively coupled to local memory 624 (if included). Local memory 624 may be operatively coupled to subsystem 600 by one or more memory channels. Local memory 624 may be accessed by one or more memory channels. It should be understood that subsystem 601 may be included on a memory module 520. Thus, it can be seen that subsystem 600 may be used as IC 121 in memory module 120, IC 321 in memory module 320, and/or IC 521 in memory module 520 and that subsystem 601 may be disposed on memory modules 120, 320, and/or 520. It can be seen that subsystem 600 may be used as IC 2610 in memory modules 2600, 2601, and/or 2602 and that subsystem 601 may be disposed on memory modules 2600, 2601, and/or 2602.

In an embodiment, a memory module having subsystem 601 (e.g., memory modules 120, 320, and/or 520) can have a memory interface configured to connect with a memory controller. Subsystem 600 may be an integrated circuit device that is coupled to the memory interface. Subsystem 600 includes CA1 interface 687 and disk interface 627. CA1 interface 687 is configured to connect to a first type of dynamic memory integrated circuit devices. Disk interface 627 may be coupled to processor 612 (if present). A plurality of the first type of dynamic memory integrated circuit devices are coupled to CA1 interface 687. At least one disk type storage device 628 coupled to subsystem 601 via the disk interface 627.

Subsystem 601 may also include a local memory 624. This local memory 624 may comprise at least one of a second type of dynamic memory integrated circuit device. Local memory 624 may connect to subsystem 600 via an interface. This interface may couple local memory 624 (if present) to processor 612 (if present) via memory/cache controller 618 (if present). Local memory 624 may be used to cache data stored in the dynamic memory integrated circuit devices coupled to CA1 interface 687. Disk type storage 628 may store an operating system that processor 612 (if present) can boot up and execute. The memory module may receive instructions via the memory interface that cause processor 612 (if present) to perform operations on data. Subsystem 600 may return the results of these operations via the memory interface.

In an embodiment, a memory module having subsystem 601 (e.g., memory modules 120, 320, and/or 520) can have a memory interface to connect to a memory channel. This memory module may include a plurality of dynamic memory integrated circuits. The memory module may have disk type storage 628. The memory module may include subsystem 600. Subsystem 600 includes CA1 interface 687, disk interface 627, and CA input interface 696, and High-speed (HS) serial DQ interface 678. CA1 interface 687 is coupled to the plurality of dynamic memory integrated circuits. Disk interface 627 is coupled to disk type storage 628 via an interface.

In an embodiment, subsystem 600 receives a memory command from a memory controller coupled to CA input interface 696. In response to this memory command, subsystem 600 stores data in the plurality of dynamic memory integrated circuits coupled to CA1 interface 687 and/or a plurality of dynamic memory integrated circuits coupled to CA0 interface 686. In response to a command by processor 612, subsystem 600 can store data in disk type storage 628.

Figure 7:
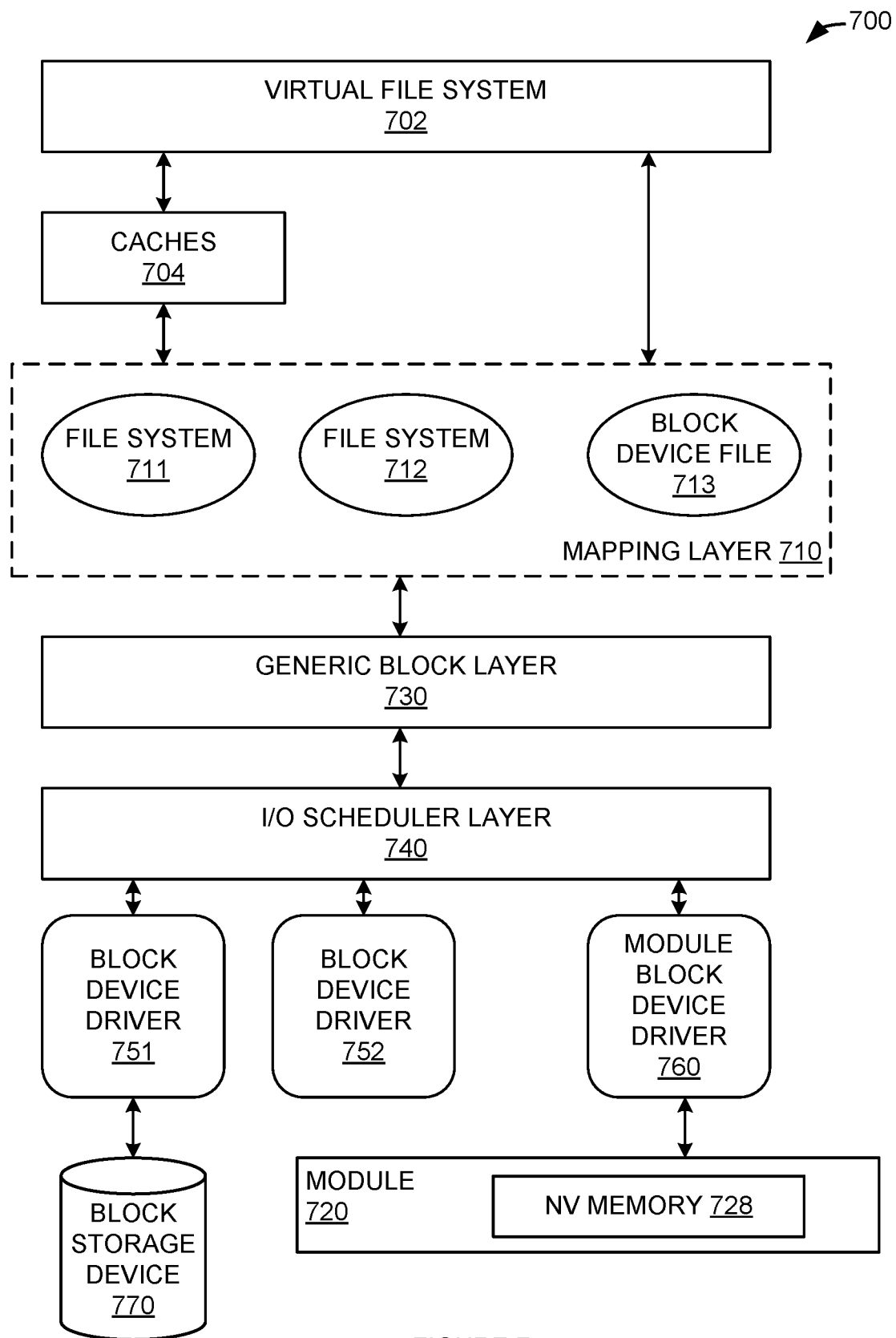
FIG. 7 is an illustration of a system for accessing file data stored in nonvolatile memory on a DRAM memory channel.

FIG. 7 is an illustration of a system for accessing file data stored in nonvolatile memory on a DRAM memory channel. In FIG. 7, system 700 is illustrated as comprised of software and hardware layers. In particular, system 700 comprises virtual file system (VFS) 702, caches 704, mapping layer 710, generic block layer 730, I/O scheduler layer 740, block device driver 751, block device driver 752, module block device driver 760, block storage device 770, and module 720. Mapping layer 710 include file system 711, file system 712, and block device file 713. Module 720 includes nonvolatile memory 728. Modules suitable for use as module 720 include module 120, module 320, and/or module 520.

Virtual file system 702 is operatively coupled to caches 704 and mapping layer 710. Caches 704 are operatively coupled to mapping layer 710. Mapping layer 710 is operatively coupled to generic block layer 730. Generic block layer 730 is operatively coupled to I/O scheduler layer 740. I/O scheduler layer is operatively coupled to block device driver 751, block device driver 752, and module block device driver 760. Block device driver 751 is operatively coupled to block storage device 770. Module block device driver is operatively coupled to module 720 and is therefore also operatively coupled to nonvolatile memory 728 to read/write data to/from nonvolatile memory 728.

In an embodiment, an application or operating system can access data stored in nonvolatile memory 728 as if that data were stored in a file on a disk drive. A read (or write) service routine call activates a VFS 702 function which is passed a file descriptor and an offset to a location inside the file. The VFS 702 function determines if the requested data is already available—for example in cache 704. If the data is already available, the VFS 702 can complete the read (or write) operation. If the data is not already available, the VFS 702 function determines how to perform the operation (e.g., read/write data from/to a block device).

Mapping layer 710 determines the block size of the file system (e.g, file system 711, file system 712) and calculates the extent of the subject data in terms of file block numbers. Mapping layer 710 invokes a file system specific function that accesses the file's disk inode and determines the location of the requested data in terms of logical block numbers. This location may be passed to the generic block layer 730.

If the operation is to a raw block device file, mapping layer 710 does not invoke a file system specific method. Instead, mapping layer 710 can translate the offset in the block device file to a corresponding location in the storage or storage partition. This location may be passed to the generic block layer 730.

Using the generic block layer 730, the kernel issues the operation on the block device. Generic block layer 730 abstracts the kernel's view of storage accessed as block devices (i.e., block storage device 770 and module 720). Generic block layer 730 informs I/O scheduler layer 740 of pending I/O data transactions. I/O scheduler layer 740 sorts and issues pending I/O data transactions to the appropriate block device driver 751-752 and/or module block device driver 760 according to kernel policies.

Block device drivers 751-752 send suitable block I/O storage type commands to block storage devices (e.g., block storage device 770). Module block device driver 760 may translate the block device commands which were received from I/O scheduler layer 740 into memory interface commands that are sent to memory module 720.

A processor on module 720 may execute all or part of module block device driver 760 to service block I/O storage type device commands for data stored in nonvolatile memory 728. The block I/O storage type device commands may include, for example, SCSI or ATA commands.

Figure 8:
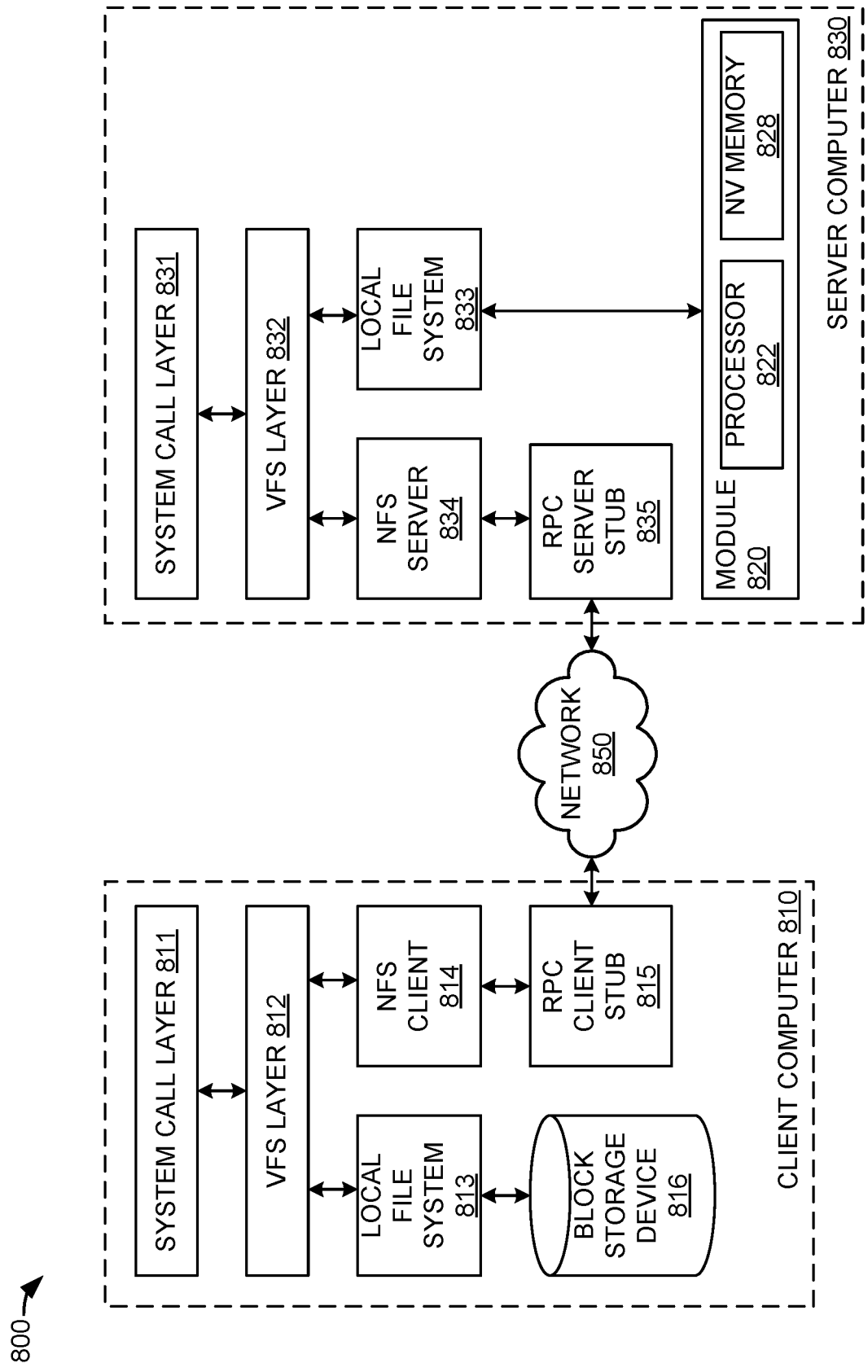
FIG. 8 is an illustration of a system for remotely accessing file data stored in nonvolatile memory on a DRAM memory channel.

FIG. 8 is an illustration of a distributed system for accessing file data stored in nonvolatile memory on a DRAM memory channel. In FIG. 8, distributed file system 800 comprises client computer 810, server computer 830, and network 850. Client computer 810 includes system call layer 811, virtual file system layer 812, local file system 813, network file system client 814, block storage device 816, remote procedure call client stub 815. Server computer 830 includes system call layer 831, virtual file system layer 832, local file system 833, network file system server 834, remote procedure call server stub 835, and module 820. Module 820 includes processor 822 and nonvolatile memory 828. It should be understood that module 820 may be, include, correspond to, or be an embodiment of, one or more of modules 120, 320, or 520, or include one or more elements of those modules (e.g., IC 121, IC 321, IC 521, subsystem 200, subsystem 400, and/or subsystem 600), described herein.

System call layer 811 of client computer 810 is operatively coupled to VFS layer 812 of client computer 810. VFS layer 812 is operatively coupled to local file system 813 of client computer 810 and NFS client 814. Local file system 813 is operatively coupled to block storage device 816 of client computer 810. NFS client 814 is operatively coupled to RPC client stub 815. RPC client stub 815 is operatively coupled to RPC server stub 835 of server computer 830 via network 850.

System call layer 831 of server computer 830 is operatively coupled to VFS layer 812 of server computer 830. RPC server stub 835 of server computer 830 is operatively coupled to NFS server 834. NFS server 834 is operatively coupled to VFS layer 832. VFS layer 832 is operatively coupled to local file system 833 of server computer 830. Local file system 833 of server computer 830 is operatively coupled to module 820. Accordingly, it should be understood that processor 822 and/or nonvolatile memory 828 of module 820 can be operatively coupled to the elements of client computer 810 via local file system 833, VFS layer 832, NFS server 834, RPC server stub 835, and network 850. In particular, processor 822 and/or nonvolatile memory 828 of module 820 can be operatively coupled to VFS layer 812 and system call layer 811 of client computer 810 via network 850. Thus, requests to read and/or write data received by system call layer 811 can be serviced by nonvolatile memory 828 on module 820 of server computer 830.

Figure 9:
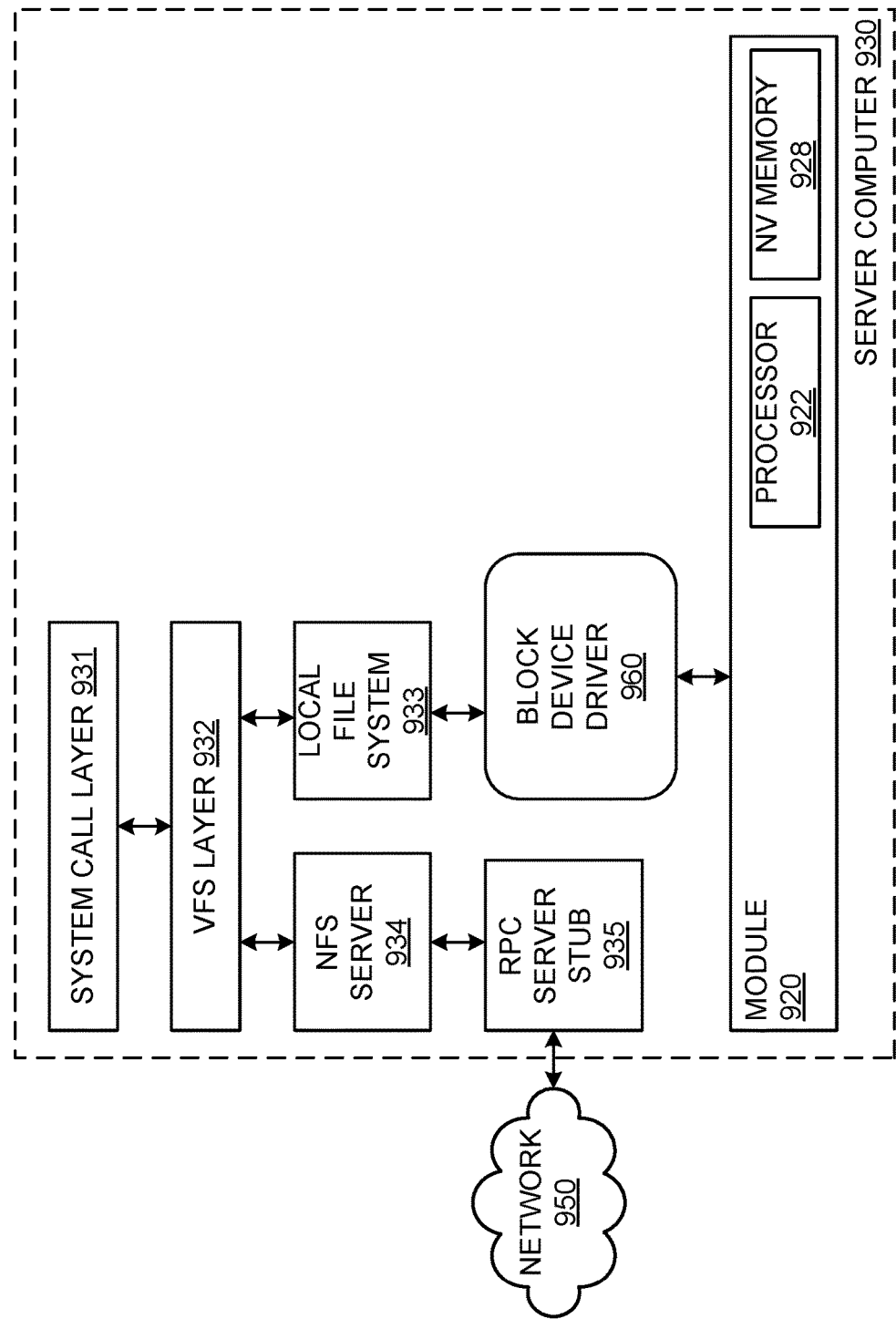
FIG. 9 is an illustration of a system for remotely accessing file data stored in nonvolatile memory on a DRAM memory channel using block I/O storage type device commands.

FIG. 9 is an illustration of a system for remotely accessing file data stored in nonvolatile memory on a DRAM memory channel using block I/O storage type device commands. In FIG. 9, distributed file system 900 is illustrated including server computer 930 and network 950. Not shown in FIG. 9 are client computers that would operatively couple to server computer 930 via network 950.

Server computer 930 includes system call layer 931, virtual file system layer 932, local file system 933, network file system server 934, remote procedure call server stub 935, block device driver 960, and module 920. Module 920 includes processor 922 and nonvolatile memory 928. It should be understood that module 920 may be, include, correspond to, or be an embodiment of, one or more of modules 120, 320, or 520, or include one or more elements of those modules (e.g., IC 121, IC 321, IC 521, subsystem 200, subsystem 400, and/or subsystem 600), described herein.

System call layer 931 of server computer 930 is operatively coupled to VFS layer 912. RPC server stub 935 of server computer 930 is operatively coupled to NFS server 934. NFS server 934 is operatively coupled to VFS layer 932. VFS layer 932 is operatively coupled to local file system 933. Local file system 933 is operatively coupled to block device driver 960. Block device driver 960 is operatively coupled to module 920. Accordingly, it should be understood that processor 922 and/or nonvolatile memory 928 of module 920 can be operatively coupled to the elements of client computers via block device driver 960, local file system 933, VFS layer 932, NFS server 934, RPC server stub 935, and network 950.

In an embodiment, local file system 933 communicates with processor 922 and/or nonvolatile memory 928 of module 920 by reading from, and writing to, an address aperture associated with module 920. This address aperture may be further divided into address ranges (a.k.a. ports) that are configured for communication of commands, status, and data. The ports of the address aperture may be configured and sized as blocks of addresses (e.g., column addresses).

In an embodiment, local file system 933 may produce I/O commands that are directed to block device driver 960. In response to an I/O command for data stored in nonvolatile memory 928 of memory module 920, block device driver 960 may direct a memory interface command to memory module 920 by reading from, and/or writing to, an address aperture associated with module 920. Block device driver 960 may translate I/O commands which block device driver 960 receives into the memory interface commands that are sent to memory module 920.

Figure 10:
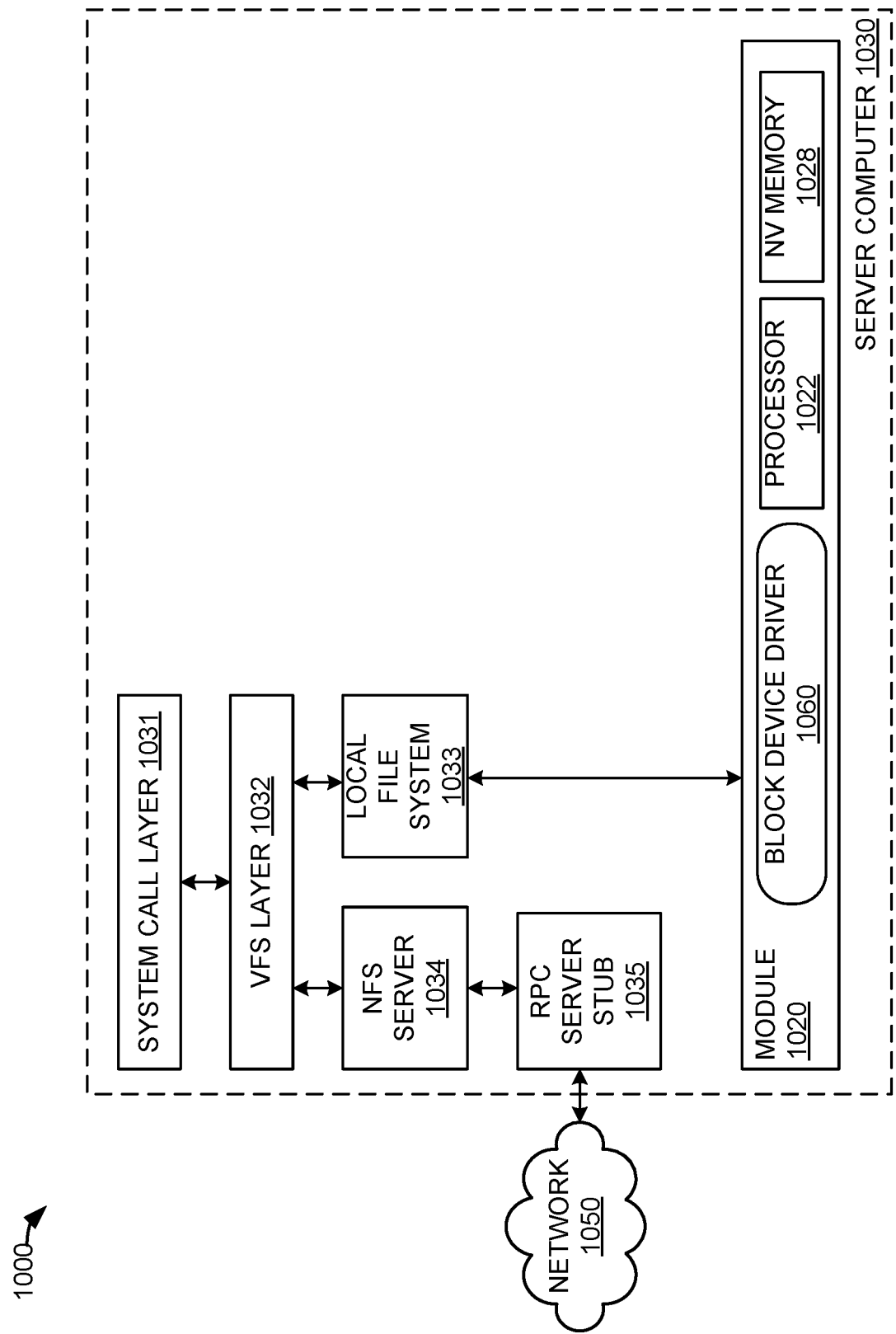
FIG. 10 is an illustration of a system for servicing remote requests for data stored in nonvolatile memory on a DRAM memory channel.

FIG. 10 is an illustration of a system for servicing remote requests for data stored in nonvolatile memory on a DRAM memory channel. In FIG. 10, distributed file system 1000 is illustrated including server computer 1030 and network 1050. Not shown in FIG. 10 are client computers that would operatively couple to server computer 1030 via network 1050.

Server computer 1030 includes system call layer 1031, virtual file system layer 1032, local file system 1033, network file system server 1034, remote procedure call server stub 1035, and module 1020. Module 1020 includes block device driver 1060, processor 1022, and nonvolatile memory 1028. Thus, it should be evident that server computer 1030 is similar to server computer 930 except for the location of the block device driver. In server computer 1030, all or part of block device driver 1060 resides on, and is executed on, module 1020. Thus, module 1020 can interface with local file system 1033, via a DRAM memory channel, using higher level abstractions. In addition, some of the processing required for servicing requests is handled by module 1020 thus freeing resources on server computer 1030. It should also be understood that module 1020 may be, include, correspond to, or be an embodiment of, one or more of modules 120, 320, or 520, or include one or more elements of those modules (e.g., IC 121, IC 321, IC 521, subsystem 200, subsystem 400, and/or subsystem 600), described herein.

System call layer 1031 of server computer 1030 is operatively coupled to VFS layer 1012. RPC server stub 1035 of server computer 1030 is operatively coupled to NFS server 1034. NFS server 1034 is operatively coupled to VFS layer 1032. VFS layer 1032 is operatively coupled to local file system 1033. Local file system 1033 is operatively coupled to module 1020 and therefore also operatively coupled to block device driver 1060. Accordingly, it should be understood that processor 1022 and/or nonvolatile memory 1028 of module 1020 can be operatively coupled to the elements of client computers via block device driver 1060, local file system 1033, VFS layer 1032, NFS server 1034, RPC server stub 1035, and network 1050.

In an embodiment, local file system 1033 communicates with block device driver 1060 of module 1020 by reading from, and writing to, an address aperture associated with module 1020, and/or block device driver 1060, in particular. This address aperture may be further divided into address ranges (a.k.a. ports) that are configured for communication of commands, status, and data. The ports of the address aperture may be configured and sized as blocks of addresses (e.g., column addresses).

In an embodiment, local file system 1033 produces I/O commands that are directed to block device driver 1060. In response to an I/O command for data stored in nonvolatile memory 1028 of memory module 1020, memory interface commands are directed to memory module 1020 by reading from, and/or writing to, an address aperture associated with module 1020, and block device driver 1060, in particular. Block device driver 1060 may translate I/O commands that block device driver 1060 receives into commands that are sent to processor 1022 and/or nonvolatile memory 1028.

Figure 11:
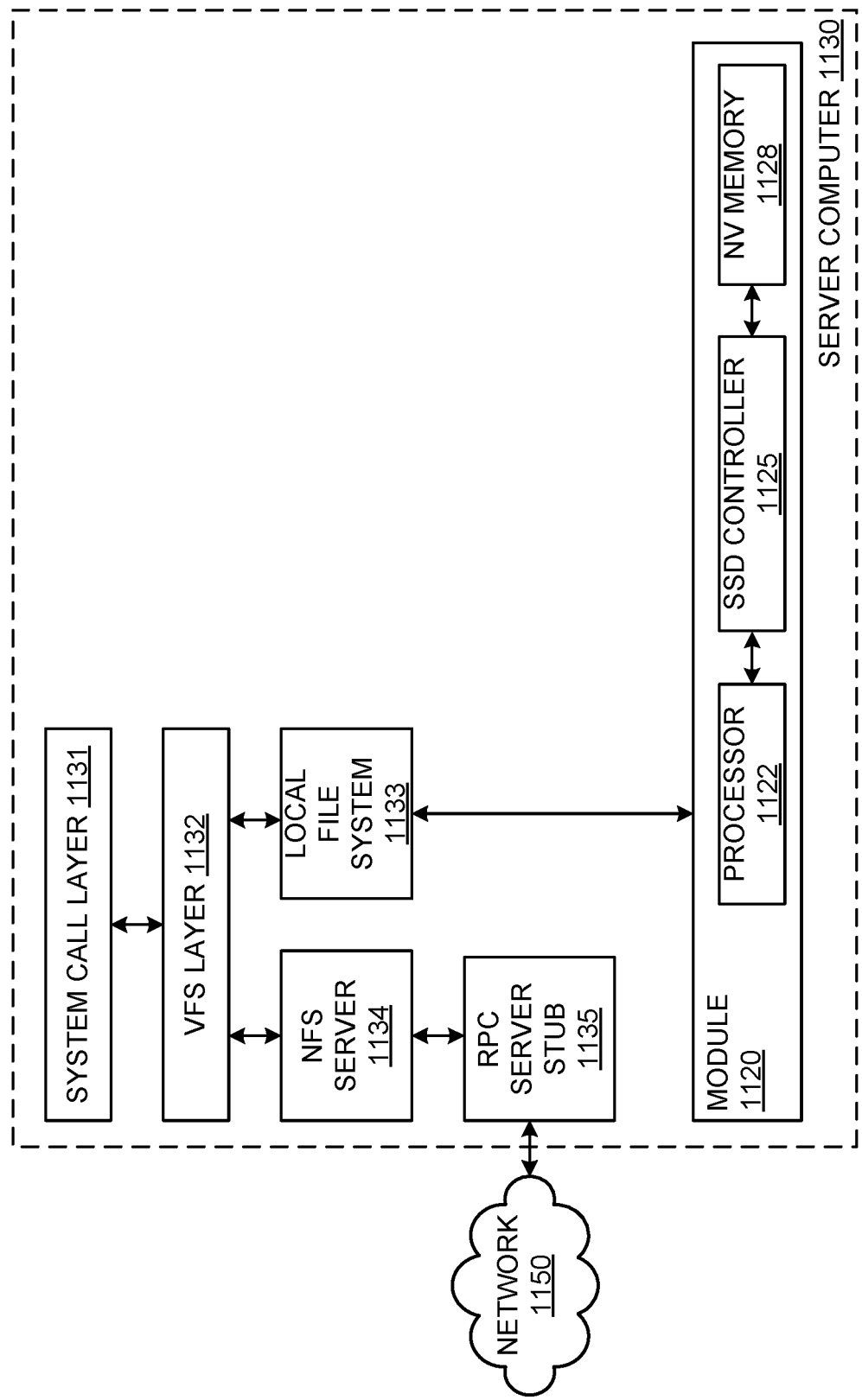
FIG. 11 is an illustration of a system for servicing remote requests to a solid-state disk on a DRAM memory channel.

FIG. 11 is an illustration of a system for servicing remote requests to a solid-state disk on a DRAM memory channel. In FIG. 11, distributed file system 1100 is illustrated including server computer 1130 and network 1150. Not shown in FIG. 11 are client computers that would operatively couple to server computer 1130 via network 1150.

Server computer 1130 includes system call layer 1131, virtual file system layer 1132, local file system 1133, network file system server 1134, remote procedure call server stub 1135, and module 1120. Module 1120 includes processor 1022, solid-state disk (SSD) controller 1125, and nonvolatile memory 1128. Thus, it should be evident that server computer 1130 is similar to server computer 830 and server computer 930 except that module 1120 explicitly includes SSD controller 1125. SSD controller 1125 provides a block I/O storage interface to processor 1122. This block I/O storage interface can be used for the communication of data to and from nonvolatile memory 1128. This block I/O storage interface may use, for example, SCSI or ATA commands. Processor 1122 may receive commands from local file system 1133 and use SSD controller 1125 and nonvolatile memory 1128 to complete those command. It should also be understood that module 1120 may be, include, correspond to, or be an embodiment of, one or more of modules 120, 320, or 520, or include one or more elements of those modules (e.g., IC 121, IC 321, IC 521, subsystem 200, subsystem 400, and/or subsystem 600), described herein.

System call layer 1131 of server computer 1130 is operatively coupled to VFS layer 1112. RPC server stub 1135 of server computer 1130 is operatively coupled to NFS server 1134. NFS server 1134 is operatively coupled to VFS layer 1132. VFS layer 1132 is operatively coupled to local file system 1133. Local file system 1133 is operatively coupled to module 1120 and therefore also operatively coupled to block device driver 1160. Accordingly, it should be understood that processor 1122, SSD controller 1125, and/or nonvolatile memory 1128 of module 1120 can be operatively coupled to the elements of client computers via processor 1122, local file system 1133, VFS layer 1132, NFS server 1134, RPC server stub 1135, and network 1150.

In an embodiment, local file system 1133 communicates with SSD controller 1125 of module 1120 by reading from, and writing to, an address aperture associated with module 1120, and/or SSD controller 1125, in particular. This address aperture may be further divided into address ranges (a.k.a. ports) that are configured for communication of commands, status, and data. The ports of the address aperture may be configured and sized as blocks of addresses (e.g., column addresses).

In an embodiment, local file system 1133 produces I/O commands that are directed to SSD controller 1125. In response to an I/O command for data stored in nonvolatile memory 1128 of memory module 1120, memory interface commands are directed to memory module 1120 by reading from, and/or writing to, an address aperture associated with module 1120, and SSD controller 1125, in particular. Processor 1122 may translate I/O commands that module 1120 receives into commands that are sent to SSD controller 1125 and/or nonvolatile memory 1128.

Figure 12:
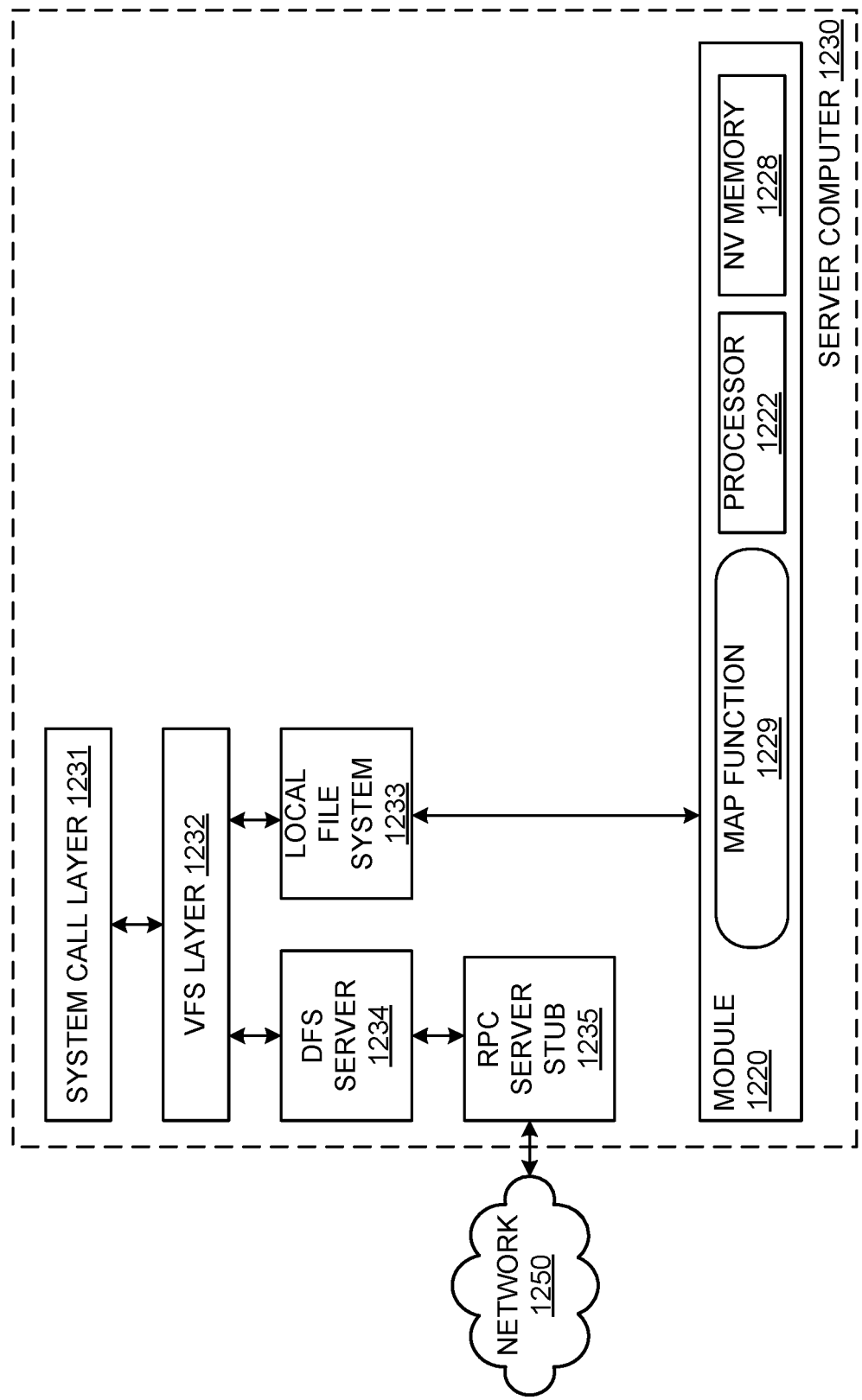
FIG. 12 is an illustration of a system for distributed file processing.

FIG. 12 is an illustration of a system for distributed file processing. In FIG. 12, distributed file processing system 1200 is illustrated including server computer 1230 and network 1250. Not shown in FIG. 12, are client nodes, master nodes, or other map processor computers that would operatively couple to server computer 1230 via network 1250.

Server computer 1230 includes system call layer 1231, virtual file system layer 1232, local file system 1233, distributed file system server 1234, remote procedure call server stub 1235, and module 1220. Module 1220 includes map function 1229, processor 1222, and nonvolatile memory 1228. In server computer 1230, all or part of a distributed file system that is optimized for mapping functionality (e.g., 'MapReduce'—for processing large data sets with a parallel, distributed algorithm on a cluster) resides on, and is executed on, module 1220. It should also be understood that module 1220 may be, include, correspond to, or be an embodiment of, one or more of modules 120, 320, or 520, or include one or more elements of those modules (e.g., IC 121, IC 321, IC 521, subsystem 200, subsystem 400, and/or subsystem 600), described herein.

System call layer 1231 of server computer 1230 is operatively coupled to VFS layer 1212. RPC server stub 1235 of server computer 1230 is operatively coupled to DFS server 1234. DFS server 1234 is operatively coupled to VFS layer 1232. VFS layer 1232 is operatively coupled to local file system 1233. Local file system 1233 is operatively coupled to module 1220 and therefore also operatively coupled to map function 1229. Map function 1229 may execute on processor 1222 using data stored by nonvolatile memory 1228. Accordingly, it should be understood that the map functions performed by map function 1229 and/or the distributed file system data stored by nonvolatile memory 1228 of module 1220 can be operatively coupled to the elements of client computers or a master node via local file system 1233, VFS layer 1232, DFS server 1234, RPC server stub 1235, and network 1250.

In an embodiment, local file system 1233 communicates with map function(s) 1229 of module 1220 by reading from, and writing to, an address aperture associated with module 1220, and/or map function 1229, in particular. This address aperture may be further divided into address ranges (a.k.a. ports) that are configured for communication of commands, status, and data. The ports of the address aperture may be configured and sized as blocks of addresses (e.g., column addresses).

Procedure calls and procedure data for map function 1229 received by module 1120 via a DRAM memory channel may be executed on the module 1220 (e.g., by processor 1222 using data stored by nonvolatile memory 1228). These procedure calls and the procedure data may be communicated to a module 1220 via memory write transactions addressed to a memory space (e.g., aperture) of the module 1220. These procedure calls may include RPC requests. Procedure calls and procedure data executed by module 1220 may also implement one or more virtual file system procedure calls. These procedure calls may include map calls that specify an application-specific map operation to be performed by module 1229 on a respective input data block to be stored using nonvolatile memory 1228. The map operation may also produce intermediate data values to be stored using nonvolatile memory 1228 or other memory on module 1220.

Figure 13:
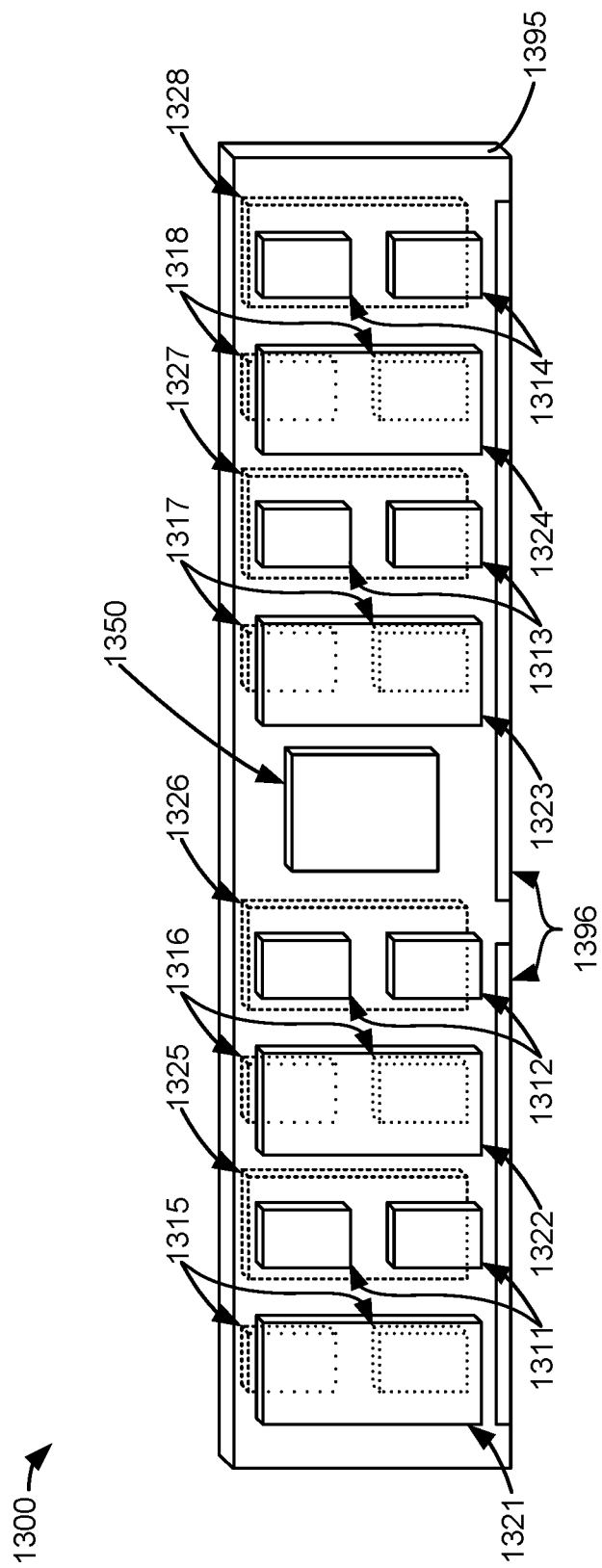
FIG. 13 is an illustration of a memory module layout for chips with heterogeneous heat production.

FIG. 13 is an illustration of a memory module layout for chips with heterogeneous heat production. In FIG. 13, memory module 1300 comprises a substrate 1395, a first type of integrated circuits 1311-1318 (e.g., DRAM memory), a second type of integrated circuits 1321-1328 (e.g., flash memory), IC 1350, and DRAM memory channel interfaces 1396. IC 1350 may be a buffer, subsystem, or processor IC as described herein.

The first type of integrated circuits 1311-1318 are interspersed on each side of substrate 1395 with the second type of integrated circuits 1321-1328. Each of the second type of integrated circuits 1321-1328 is separated from another of the second type of integrated circuits 1321-1328 by one or more of the first type of integrated circuits 1311-1318. In FIG. 3, each of the second type of integrated circuits 1321-1328 is separated from another of the second type of integrated circuits 1321-1328 by two of the first type of integrated circuits 1311-1318.

In an embodiment, each of the second type of integrated circuits 1321-1328 on a first side of substrate 1395 (e.g., IC's 1321-1324) is substantially aligned to integrated circuits of the first type 1311-1318 on the second side of the substrate (e.g., IC's 1315-1318). In other words, IC 1321 on the front side of substrate 1395 is substantially aligned to IC's 1315 on the back side of substrate 1395; IC 1322 on the front side of substrate 1395 is substantially aligned to IC's 1316 on the back side of substrate 1395, and so on.

It should be understood that the first type of IC's 1311-1318 may have substantially different power dissipation (at any given time) than the second type of IC's 1321-1328. This difference in power dissipation may be due to the inherent properties of IC's 1311-1318 and 1321-1328, or due to differing workloads associated with of IC's 1311-1318 and 1321-1328. Interspersing IC's 1311-1318 and 1321-1328 on each side of substrate 1395 helps improve the uniformity of power dissipation between sides of module 1300. Improving the uniformity of power dissipation between sides of module 1300 can help prevent warping of substrate 1395. Warping of substrate 1395 may lead to solder cracking, and module 1300 failure. Improving the uniformity of power dissipation between sides of module 1300 may also prevent one side of the module from determining the power and thermal limits for the entire module 1300.

FIG. 14 is a flowchart illustrating a method of operating a memory module. The steps illustrated in FIG. 14 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At an integrated circuit device, a memory command from a memory controller connected to a memory interface of a memory module is received; the integrated circuit device has a processor, a first interface, a second interface, and a nonvolatile memory. The first interface is connected to a plurality of dynamic memory integrated circuits. The second interface received the memory command from the memory controller (1402). For example, integrated circuit device 321 may receive from memory controller 314 (which is coupled to a memory interface of module 320) a memory command. Integrated circuit device 321 may be, for example, system 400. System 400 has CA0 interface 486 and CA1 interface 487 that may be connected to CPU memory 323. System 400 has NV memory 428 (which can correspond to NV memory 328). System 400 has CA input interface 496 which can receive the memory command from memory controller 114.

In response to the memory command, data is stored in the plurality of dynamic memory integrated circuits (1404). For example, in response to a command received via CA input interface 496 from memory controller 314, system 400 may store data in dynamic memory integrated circuits connected to CA0 interface 486 or CA1 interface 487 (e.g., CPU memory 323).

In response to a command from the processor, data is stored in at least one nonvolatile memory integrated circuit device (1406). For example, system 400 may store, in response to processor 412 (or processor 322) and in NV memory 428, data stored in CPU memory 323, local memory 424, and/or dynamic memory connected to CA0 interface 486 and CA1 interface 487.

FIG. 15 is a flowchart illustrating a method of operating a memory module. The steps illustrated in FIG. 15 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At an integrated circuit device, a memory command from a memory controller connected to a memory interface of a memory module is received; the integrated circuit device has a solid-state disk controller circuit, a first interface, a second interface, and a third interface. The first interface is connected to a plurality of dynamic memory integrated circuits. The second interface is connected to at least one nonvolatile memory integrated circuit device. The third interface received the memory command from the memory controller (1502). For example, integrated circuit device 121 may receive from memory controller 114 (which is coupled to a memory interface of module 120) a memory command. Integrated circuit device 121 may be, for example, system 200. System 200 has CA0 interface 286 and CA1 interface 287 that may be connected to CPU memory 123. System 200 has NV controller 227 (which may be a solid-state disk controller circuit and can correspond to NV controller 125) to interface to NV memory 228 (which can correspond to NV memory 128). System 200 has CA input interface 296 which can receive the memory command from memory controller 114.

In response to the memory command, data is stored in the plurality of dynamic memory integrated circuits (1504). For example, in response to a command received via CA input interface 296 from memory controller 114, system 200 may store data in dynamic memory integrated circuits connected to CA0 interface 286 or CA1 interface 287 (e.g., CPU memory 123).

In response to a command from the solid-state disk controller circuit, data is stored in at least one nonvolatile memory integrated circuit device (1506). For example, system 200 may store, in NV memory 228 and in response to a solid-state disk controller circuit that is, or is included in, NV controller 227, data stored in CPU memory 123, local memory 224, and/or dynamic memory connected to CA0 interface 286 and CA1 interface 287.

Figure 16:
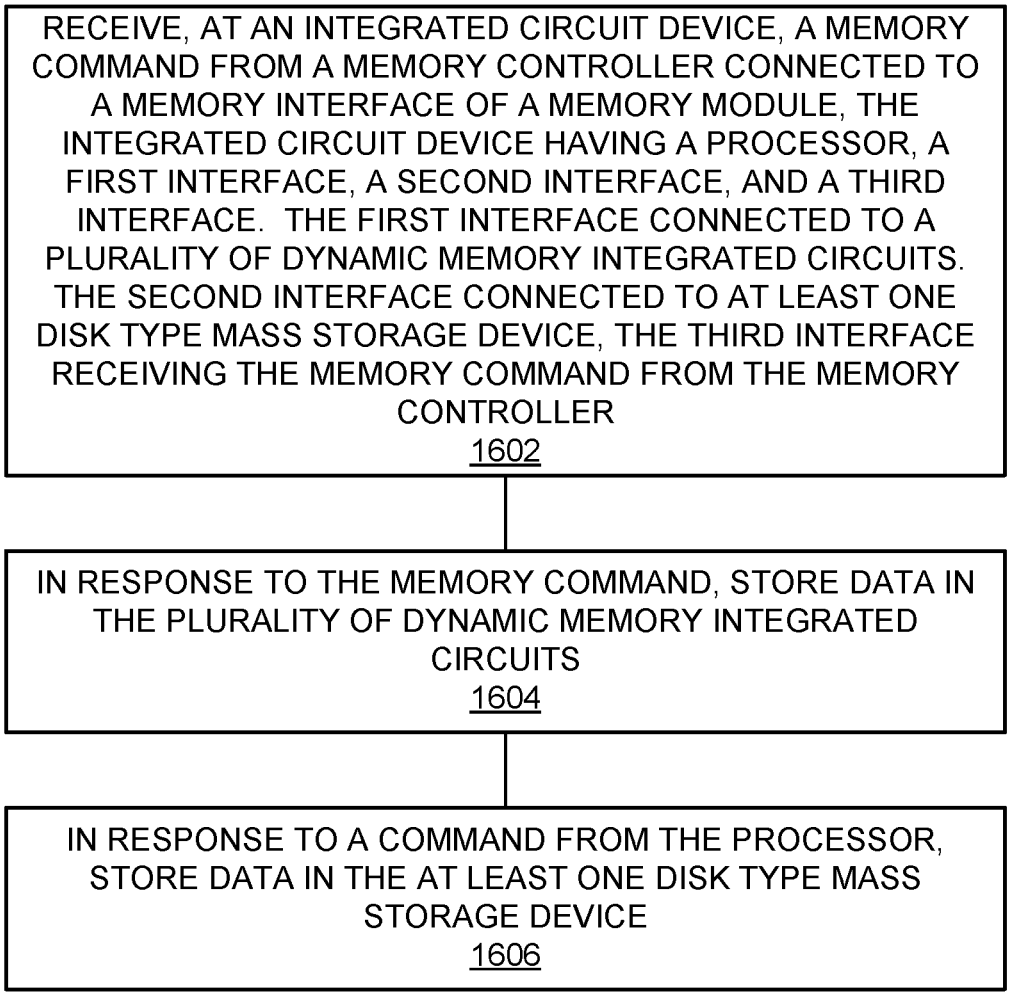
FIG. 16 is a flowchart illustrating a method of operating a memory module.

FIG. 16 is a flowchart illustrating a method of operating a memory module. The steps illustrated in FIG. 16 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At an integrated circuit device, a memory command from a memory controller connected to a memory interface of a memory module is received; the integrated circuit device has a processor, a first interface, a second interface, and a third interface. The first interface is connected to a plurality of dynamic memory integrated circuits. The second interface is connected to at least one disk type mass storage device. The third interface received the memory command from the memory controller (1602). For example, integrated circuit device 521 may receive from memory controller 514 (which is coupled to a memory interface of module 520) a memory command. Integrated circuit device 521 may be, for example, system 600. System 600 has CA0 interface 686 and CA1 interface 687 that may be connected to CPU memory 523. System 600 has disk interface 627 (which can correspond to disk interface 525) to interface to disk type storage 628 (which can correspond to disk type storage 628). System 600 has CA input interface 696 which can receive the memory command from memory controller 514.

In response to the memory command, data is stored in the plurality of dynamic memory integrated circuits (1604). For example, in response to a command received via CA input interface 696 from memory controller 514, system 600 may store data in dynamic memory integrated circuits connected to CA0 interface 686 or CA1 interface 687 (e.g., CPU memory 523).

In response to a command from the processor, data is stored in at least one disk type mass storage device (1606). For example, system 600 may store, in response to processor 612 (or processor 622) and in disk type storage 628, data stored in CPU memory 523, local memory 624, and/or dynamic memory connected to CA0 interface 686 and CA1 interface 687.

Figure 17:
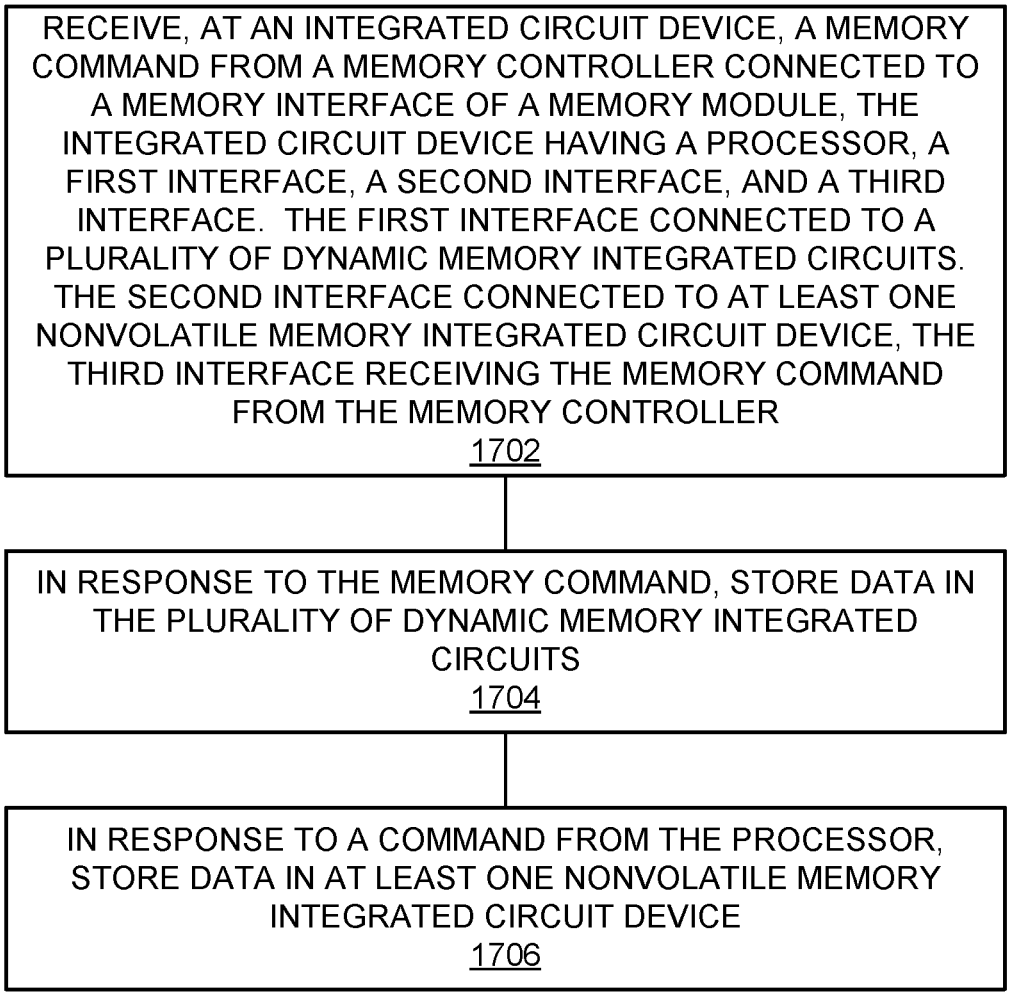
FIG. 17 is a flowchart illustrating a method of operating a memory module.

FIG. 17 is a flowchart illustrating a method of operating a memory module. The steps illustrated in FIG. 17 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At an integrated circuit device, a memory command from a memory controller connected to a memory interface of a memory module is received; the integrated circuit device has a processor, a first interface, a second interface, and a third interface. The first interface is connected to a plurality of dynamic memory integrated circuits. The second interface is connected to at least one nonvolatile memory integrated circuit device. The third interface received the memory command from the memory controller (1702). For example, integrated circuit device 121 may receive from memory controller 114 (which is coupled to a memory interface of module 120) a memory command. Integrated circuit device 121 may be, for example, system 200. System 200 has CA0 interface 286 and CA1 interface 287 that may be connected to CPU memory 123. System 200 has NV controller 227 (which can correspond to NV controller 125) to interface to NV memory 228 (which can correspond to NV memory 128). System 200 has CA input interface 296 which can receive the memory command from memory controller 114.

In response to the memory command, data is stored in the plurality of dynamic memory integrated circuits (1704). For example, in response to a command received via CA input interface 296 from memory controller 114, system 200 may store data in dynamic memory integrated circuits connected to CA0 interface 286 or CA1 interface 287 (e.g., CPU memory 123).

In response to a command from the processor, data is stored in at least one nonvolatile memory integrated circuit device (1706). For example, system 200 may store, in response to processor 212 (or processor 122) and in NV memory 228, data stored in CPU memory 123, local memory 224, and/or dynamic memory connected to CA0 interface 286 and CA1 interface 287.

Figure 18:
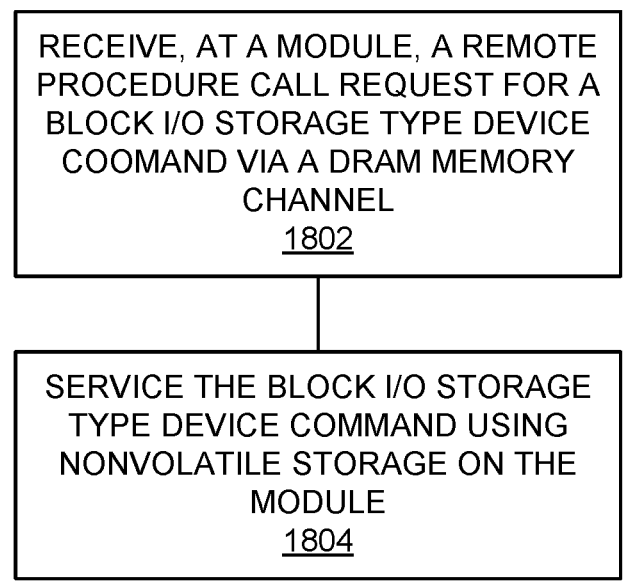
FIG. 18 is a flowchart illustrating a method of servicing remote procedure call requests.

FIG. 18 is a flowchart illustrating a method of operating a memory module. The steps illustrated in FIG. 18 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At a module, a remote procedure call request for a block I/O storage type device command is received via a DRAM memory channel (1802). For example, module 120 may receive a remote procedure call request for a block I/O storage type device (e.g., block read of an SSD) via the DRAM memory channel that coupled module 120 and memory controller 114.

The block I/O storage type device command is serviced using nonvolatile storage on the module (1804). For example, a remote procedure call response may be provided using data stored on nonvolatile memory 128. The remote procedure call response may be communicated via the DRAM memory channel that couples module 120 and memory controller 114.

Figure 19:
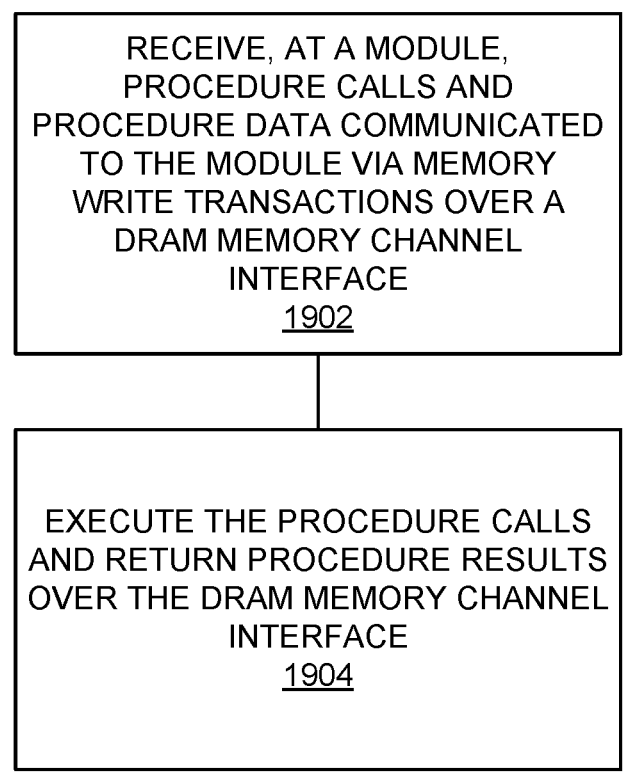
FIG. 19 is a flowchart illustrating a method of communicating and servicing remote procedure call requests.

FIG. 19 is a flowchart illustrating a method of operating a memory module. The steps illustrated in FIG. 19 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At a module, procedure calls and procedure data communicated to the module via memory write transactions over a DRAM memory channel interface are received (1902). For example, procedure calls and procedure data communicated to module 120 via memory write transactions over the DRAM memory channel interface that links module 120 and memory controller 114 may be received by module 120.

The procedure calls and are executed and the return procedure results are returned over the DRAM memory channel interface (1904). For example, processor 122 may execute the procedure calls and generate procedure results that are stored in nonvolatile memory 128. The procedure results that are stored in nonvolatile memory 128 may be returned in response to read commands that communicate the result data via the DRAM memory channel interface that links module 120 and memory controller 114.

Figure 20:
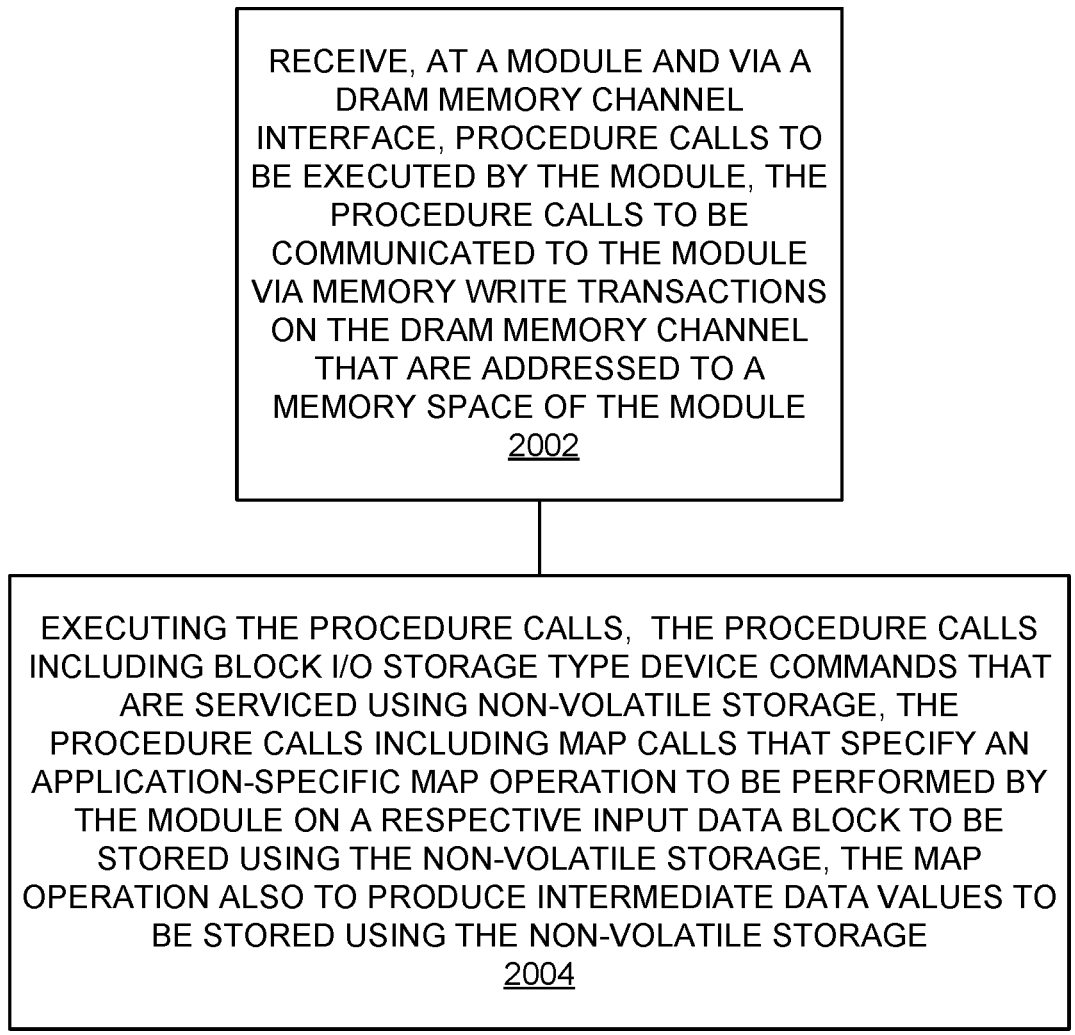
FIG. 20 is a flowchart illustrating method of performing distributed processing functions.

FIG. 20 is a flowchart illustrating a method of operating a memory module. The steps illustrated in FIG. 20 may be performed by one or more elements of system 100, system 300, system 500, system 700, system 800, system 900, system 1000, system 1100, subsystem 200, subsystem 201, subsystem 400, subsystem 401, subsystem 600, and/or subsystem 601, and/or their components. At a module, and via a DRAM memory channel interface, procedure calls to be executed by the module are received via memory write transactions on the DRAM memory channel and are addressed to a memory space of the module (2002). For example, module 120 may receive, from memory controller 114, memory write transactions addressed to the memory space of module 120. These memory write transaction may communicate procedure calls to be executed by the module (e.g., remote procedure calls, or function calls).

The procedure calls, which include block I/O storage type device commands that are serviced using non-volatile storage, and include map calls that specify an application-specific map operation to be performed by the module on a respective input data block to be stored using the non-volatile storage, and the map operation to also produce intermediate data values to be stored using the non-volatile storage, are executed (2004). For example, module 120 may be controlled to perform 'MapReduce' map type functions using data stored using nonvolatile memory 128.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to, one or more elements of system 100, system 200, system 300, system 400, system 500, system 600, system 700, system 800, system 900, system 1000, system 1100, system 1200, and/or module 1300, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 21:
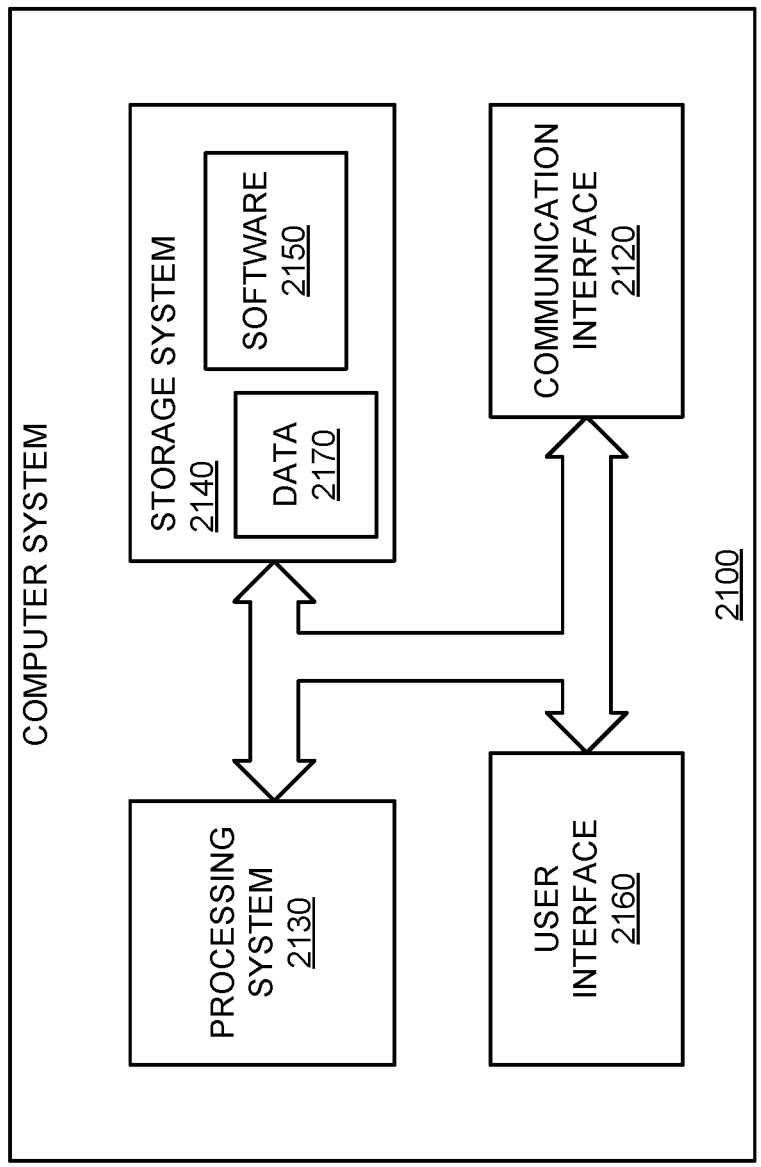
FIG. 21 is block diagram of a computer.

FIG. 21 illustrates a block diagram of a computer system. Computer system 2100 includes communication interface 2120, processing system 2130, storage system 2140, and user interface 2160. Processing system 2130 is operatively coupled to storage system 2140. Storage system 2140 stores software 2150 and data 2170. Computer system 2100 may include one or more of system 100, system 200, system 300, system 400, system 500, system 600, system 700, system 800, system 900, system 1000, system 1100, system 1200, and/or module 1300, or components that implement the methods, functions, processing, communication, circuits, and/or systems described herein. Processing system 2130 is operatively coupled to communication interface 2120 and user interface 2160. Computer system 2100 may comprise a programmed general-purpose computer. Computer system 2100 may include a microprocessor. Computer system 2100 may comprise programmable or special purpose circuitry. Computer system 2100 may be distributed among multiple devices, processors, storage, and/or interfaces that together comprise elements 2120-2170.

Communication interface 2120 may comprise a network interface, modem, port, bus, link, transceiver, or other communication device. Communication interface 2120 may be distributed among multiple communication devices. Processing system 2130 may comprise a microprocessor, microcontroller, logic circuit, or other processing device. Processing system 2130 may be distributed among multiple processing devices. User interface 2160 may comprise a keyboard, mouse, voice recognition interface, microphone and speakers, graphical display, touch screen, or other type of user interface device. User interface 2160 may be distributed among multiple interface devices. Storage system 2140 may comprise a disk, tape, integrated circuit, RAM, ROM, EEPROM, flash memory, network storage, server, or other memory function. Storage system 2140 may include computer readable medium. Storage system 2140 may be distributed among multiple memory devices.

Processing system 2130 retrieves and executes software 2150 from storage system 2140. Processing system 2130 may retrieve and store data 2170. Processing system 2130 may also retrieve and store data via communication interface 2120. Processing system 2130 may create or modify software 2150 or data 2170 to achieve a tangible result. Processing system 2130 may control communication interface 2120 or user interface 2160 to achieve a tangible result. Processing system 2130 may retrieve and execute remotely stored software via communication interface 2120.

Software 2150 and remotely stored software may comprise an operating system, utilities, drivers, networking software, and other software typically executed by a computer system. Software 2150 may comprise an application program, applet, firmware, or other form of machine-readable processing instructions typically executed by a computer system. When executed by processing system 2130, software 2150 or remotely stored software may direct computer system 2100 to operate.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A module, comprising:
a substrate having a memory module form factor, the substrate having an interface disposed on the substrate that is configured to communicate with a DRAM memory channel that is external to the module, the substrate configured to be removably connected to the DRAM memory channel, the interface including command/address connections and data connections to connect to command/address links and bidirectional data links, respectively, of the DRAM memory channel;
non-volatile storage disposed on the substrate, the module configured to service remote procedure call requests using the non-volatile storage on the module, the remote procedure call requests and procedure data to be received by the module via the bidirectional data links of the DRAM memory channel that is external to the module; and,
a processor, disposed on the substrate, to execute the remote procedure call requests, results of the remote procedure call requests to be output to the bidirectional data links of the DRAM memory channel via the data connections of the interface.

2. The module of claim 1, wherein the remote procedure call requests originate from a processor not directly connected to the DRAM memory channel and not directly connected to the module.

3. The module of claim 1, wherein the remote procedure call requests include storage commands are block I/O storage type device commands.

4. The module of claim 3, wherein the processor disposed on the substrate is to execute a block storage I/O driver that services the block I/O storage type device commands for data stored in the non-volatile storage and to return results of the block storage I/O type device commands via the bidirectional data links of the DRAM memory channel that is external to the module.

5. The module of claim 4, further comprising:
a solid-state disk controller disposed on the substrate coupled to provide a block I/O storage interface to the processor for the communication of data stored in the non-volatile storage.

6. The module of claim 5, wherein the block I/O storage interface uses at least one of SCSI commands and ATA commands.

7. The module of claim 2, wherein the remote procedure call requests to be received by the module via the bidirectional data links of the DRAM memory channel that is external to the module are communicated to the module via memory write transactions of the DRAM memory channel that are addressed to a memory space that corresponds to the module.

8. A module, comprising:
a substrate having a memory module form factor; and,
a DRAM memory channel interface disposed on the substrate to receive, from a DRAM memory channel that includes command/address links and bidirectional data links and that is external to the module, remote procedure calls and procedure data for execution on the module by a processor disposed on the substrate that is configured to execute the remote procedure calls, the remote procedure calls and the procedure data to be communicated to the module via memory write transactions addressed to a memory space that corresponds to the module, the memory write transactions to use the bidirectional data links of the DRAM memory channel to communicate the remote procedure calls and the procedure data to the DRAM memory channel interface, the substrate configured to be removably connected to the DRAM memory channel, results of the remote procedure calls to be communicated to the bidirectional data links of the DRAM memory channel via the DRAM memory channel interface.

9. The module of claim 8, wherein the remote procedure calls include block I/O storage type device commands.

10. The module of claim 8, wherein the remote procedure calls and the procedure data implement virtual file system procedure calls.

11. The module of claim 8, further comprising:
non-volatile storage disposed on the module configured to be accessed using block I/O storage type device commands.

12. The module of claim 11, wherein said non-volatile storage is accessed using network file system requests communicated to the module via the memory write transactions addressed to the memory space that corresponds to the module.

13. The module of claim 11, wherein said non-volatile storage is accessed using Hadoop distributed file system requests communicated to the module via the memory write transactions addressed to the memory space that corresponds to the module.

14. A module comprising:
a substrate having a memory module form factor;
non-volatile storage disposed on the substrate; and,
a DRAM memory channel interface disposed on the substrate to receive, via bidirectional data links of a DRAM memory channel that includes command/address links and the bidirectional data links and that is external to the module, remote procedure call requests and procedure data, a processor disposed on the substrate to service the remote procedure call requests using the non-volatile storage and to output results of the remote procedure call requests to the bidirectional data links of the DRAM memory channel that is external to the module via the DRAM memory channel interface, the substrate configured to be removably connected to the DRAM memory channel.

15. The module of claim 14, wherein the non-volatile storage is a solid-state disk drive (SSD).

16. The module of claim 14, wherein the remote procedure call requests include requests that are directed to a disk drive type block I/O storage device.

17. The module of claim 14, wherein a distributed file system is implemented using data stored in the non-volatile storage.

18. The module of claim 7, wherein the memory space that corresponds to the module is treated, by a second processor that controls the DRAM memory channel, as at least one of write combining memory and write back memory.

19. The module of claim 12, wherein the memory space that corresponds to the module is treated, by a second processor that controls the DRAM memory channel, as at least one of write combining memory and write back memory.

20. The module of claim 14, wherein the remote procedure call requests to be received by the module via the bidirectional data links of the DRAM memory channel that is external to the module are communicated to the module via memory write transactions of the DRAM memory channel that are treated, by a second processor that controls the DRAM memory channel, as at least one of write combining memory and write back memory.

* * * * *